(12) United States Patent
Kusunoki et al.

(10) Patent No.: US 8,373,207 B2
(45) Date of Patent: Feb. 12, 2013

(54) SEMICONDUCTOR DEVICE

(75) Inventors: Shigeru Kusunoki, Chiyoda-ku (JP);
Shinichi Ishizawa, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 95 days.

(21) Appl. No.: 12/901,734

(22) Filed: Oct. 11, 2010

(65) Prior Publication Data
US 2011/0140179 A1 Jun. 16, 2011

(30) Foreign Application Priority Data
Dec. 16, 2009 (JP) ................................. 2009-285233

(51) Int. Cl.
*H01L 29/80* (2006.01)

(52) U.S. Cl. ........ 257/256; 257/173; 257/359; 257/360; 438/186

(58) Field of Classification Search .................. 257/173, 257/256, 359–360; 438/186
See application file for complete search history.

(56) References Cited

U.S. PATENT DOCUMENTS

| | | | | |
|---|---|---|---|---|
| 4,742,380 A * | 5/1988 | Chang et al. | ................... | 257/125 |
| 5,747,835 A * | 5/1998 | Pezzani | ........................ | 257/113 |
| 5,869,872 A * | 2/1999 | Asai et al. | ...................... | 257/360 |
| 6,034,385 A * | 3/2000 | Stephani et al. | ............... | 257/263 |
| 6,051,856 A * | 4/2000 | McKay et al. | ................. | 257/289 |
| 6,222,223 B1 * | 4/2001 | Tobita | ............................ | 257/311 |
| 6,320,232 B1 * | 11/2001 | Gossner et al. | ................ | 257/360 |
| 6,462,380 B1 * | 10/2002 | Duvvury et al. | ............... | 257/355 |
| 6,625,057 B2 * | 9/2003 | Iwata | ............................. | 365/158 |
| 6,815,657 B2 * | 11/2004 | Toyoshima et al. | ........ | 250/214 R |
| 7,656,086 B2 * | 2/2010 | Kim | ............................... | 313/506 |
| 7,718,966 B2 * | 5/2010 | Ueno | ........................... | 250/338.4 |
| 7,868,353 B2 * | 1/2011 | Machida et al. | ................ | 257/133 |
| 7,982,248 B2 * | 7/2011 | Saito et al. | ...................... | 257/256 |
| 8,049,223 B2 * | 11/2011 | Shimizu et al. | .................. | 257/77 |
| 8,164,093 B2 * | 4/2012 | Ando et al. | ...................... | 257/59 |
| 2002/0113274 A1 * | 8/2002 | Iwagami et al. | ............... | 257/379 |
| 2003/0047750 A1 * | 3/2003 | Russ et al. | ...................... | 257/173 |
| 2003/0178654 A1 * | 9/2003 | Thornton | ....................... | 257/263 |

(Continued)

FOREIGN PATENT DOCUMENTS

| | | |
|---|---|---|
| JP | 2000-505239 | 4/2000 |
| JP | 2002246599 A * | 8/2002 |

(Continued)

OTHER PUBLICATIONS

Office Action issued Apr. 24, 2012 in Japanese Patent Application No. 2009-285233 (with English translation).

*Primary Examiner* — Fernando L Toledo
*Assistant Examiner* — Mohammed Shamsuzzaman
(74) *Attorney, Agent, or Firm* — Oblon, Spivak, McClelland, Maier & Neustadt, L.L.P.

(57) ABSTRACT

A semiconductor device includes: a rectifying element; an electrode pad electrically connected to the rectifying element; and a resistance and a depletion transistor arranged between the rectifying element and the electrode pad, and electrically connected to each other. The semiconductor device has a configuration in which the rectifying element, the resistance, the depletion transistor, and the electrode pad are serially connected. The semiconductor device is configured to generate a gate potential of the depletion transistor based on a difference in potential across the resistance and to produce a depletion layer in a channel of the depletion transistor based on the gate potential. As a result, a semiconductor device having reasonably large current at low voltage and small current at high voltage can be obtained.

13 Claims, 19 Drawing Sheets

U.S. PATENT DOCUMENTS

| | | | |
|---|---|---|---|
| 2004/0183583 A1* | 9/2004 | Mizuno | 327/389 |
| 2005/0136606 A1* | 6/2005 | Rulke et al. | 438/305 |
| 2005/0167786 A1* | 8/2005 | Gill et al. | 257/573 |
| 2005/0179089 A1* | 8/2005 | Shimizu | 257/358 |
| 2006/0255373 A1* | 11/2006 | Elpelt et al. | 257/256 |
| 2008/0185661 A1* | 8/2008 | Takeoka | 257/384 |
| 2008/0290841 A1* | 11/2008 | Chang et al. | 320/166 |
| 2009/0014816 A1* | 1/2009 | Hayashi et al. | 257/409 |
| 2009/0146701 A1* | 6/2009 | Noguchi et al. | 327/144 |
| 2009/0212843 A1* | 8/2009 | Deboy | 327/377 |
| 2010/0001283 A1* | 1/2010 | Manna et al. | 257/66 |
| 2010/0078724 A1* | 4/2010 | Imoto et al. | 257/355 |
| 2010/0097364 A1* | 4/2010 | Ando et al. | 345/211 |
| 2010/0127259 A1* | 5/2010 | Nozu | 257/49 |
| 2010/0127652 A1* | 5/2010 | Morita et al. | 318/400.27 |
| 2010/0283116 A1* | 11/2010 | Shimizu | 257/500 |
| 2010/0327942 A1* | 12/2010 | Deboy | 327/377 |
| 2011/0073950 A1* | 3/2011 | Tsutsumi et al. | 257/358 |
| 2011/0079835 A1* | 4/2011 | Noguchi et al. | 257/298 |
| 2011/0133816 A1* | 6/2011 | Wu et al. | 327/434 |
| 2011/0163794 A1* | 7/2011 | Soma et al. | 327/534 |

FOREIGN PATENT DOCUMENTS

| | | |
|---|---|---|
| JP | 2007-53387 | 3/2007 |
| JP | 2008205592 A * | 9/2008 |

* cited by examiner

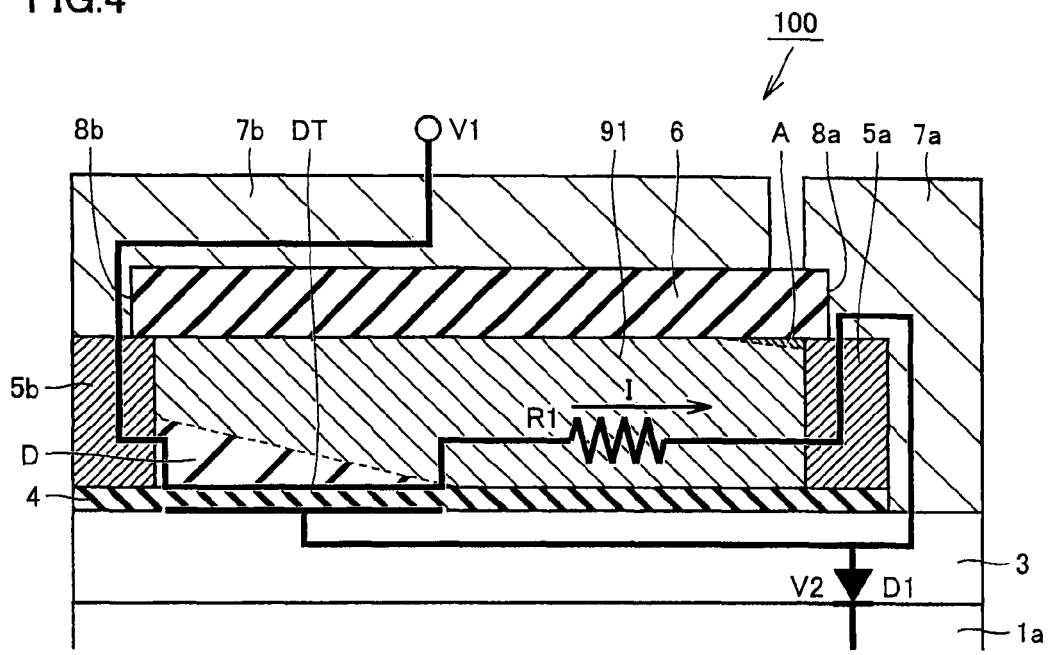
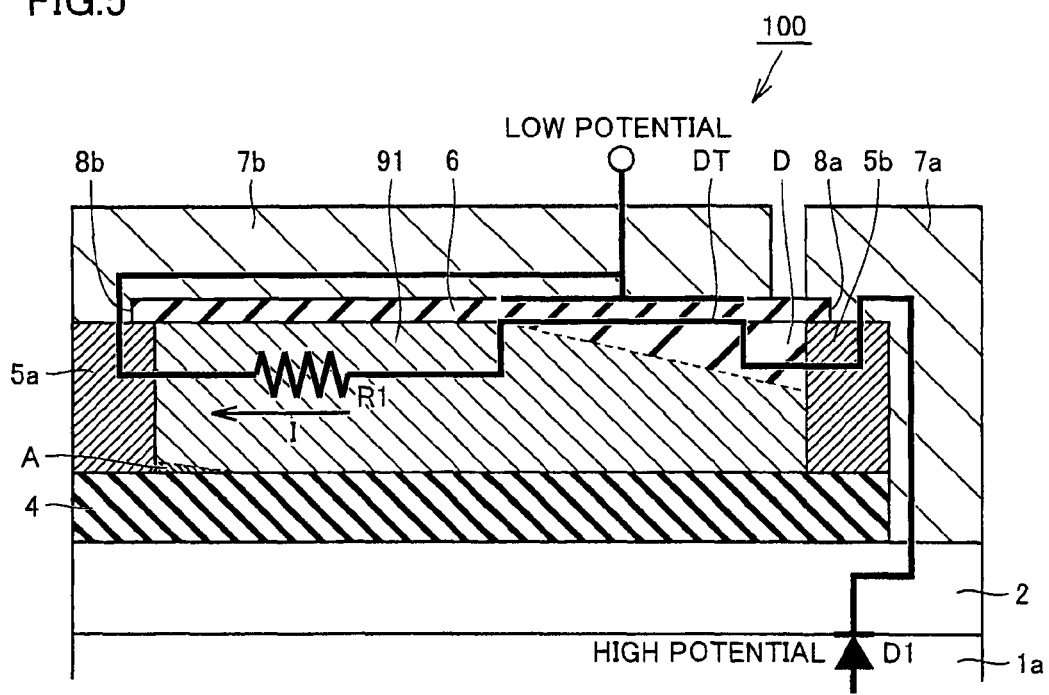

SEMICONDUCTOR DEVICE

BACKGROUND OF THE INVENTION

1. Field of the Invention

The present invention relates to a semiconductor device, and in particular, to a semiconductor device that produces a depletion layer in a channel of a transistor.

2. Description of the Background Art

Generally, as for a passive element such as a diode and a resistance, the more voltage is applied, the more current flows through the element. As for a diode, in particular, the more voltage is applied, the larger an increase in current becomes. In a bootstrap diode, for example, a relatively large voltage is applied instantaneously during power-on until a capacitor is charged, and thus, a large current flows through the diode. On the other hand, in the normal operation state, a voltage of only approximately several volts is applied, and thus, a small current flows through the diode. In the bootstrap diode, a resistance is serially connected to the diode in order to cancel the characteristic of the diode that the more voltage is applied, the larger an increase in current becomes.

A component for limiting a current flow includes, for example, a current-limiting semiconductor switch. In Japanese National Patent Publication No. 2000-505239, for example, the current-limiting semiconductor switch is proposed.

The characteristics desired in the bootstrap diode are to avoid the large current during power-on and to decrease the loss during the normal operation or increase the operation speed during the normal operation. In order to have such characteristics, desired is the characteristic of reasonably large current at low voltage and small current at high voltage. In the conventional bootstrap diode, however, this characteristic cannot be obtained because the resistance is serially connected to the diode.

SUMMARY OF THE INVENTION

The present invention has been made in light of the above problems, and an object thereof is to provide a semiconductor device having reasonably large current at low voltage and small current at high voltage.

A semiconductor device of the present invention includes: a rectifying element; an electrode pad electrically connected to the rectifying element; and a resistance and a depletion transistor arranged between the rectifying element and the electrode pad, and electrically connected to each other. The semiconductor device has a configuration in which the rectifying element, the resistance, the depletion transistor, and the electrode pad are serially connected. The semiconductor device is configured to generate a gate potential of the depletion transistor based on a difference in potential across the resistance and to produce a depletion layer in a channel of the depletion transistor based on the gate potential.

According to the semiconductor device of the present invention, there can be provided a semiconductor device having reasonably large current at low voltage and small current at high voltage because the semiconductor device is configured to produce the depletion layer in the channel of the depletion transistor based on the gate potential.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 schematically illustrates a cross-sectional structure on the anode side of the semiconductor device in the first embodiment of the present invention and an equivalent circuit thereof.

FIG. 5 schematically illustrates a cross-sectional structure on the cathode side of the semiconductor device in the first embodiment of the present invention and an equivalent circuit thereof.

DESCRIPTION OF THE PREFERRED EMBODIMENTS

Embodiments of the present invention will be described hereinafter based on the drawings.

First Embodiment

First, a configuration of a semiconductor device according to a first embodiment of the present invention will be described.

Figure 1:
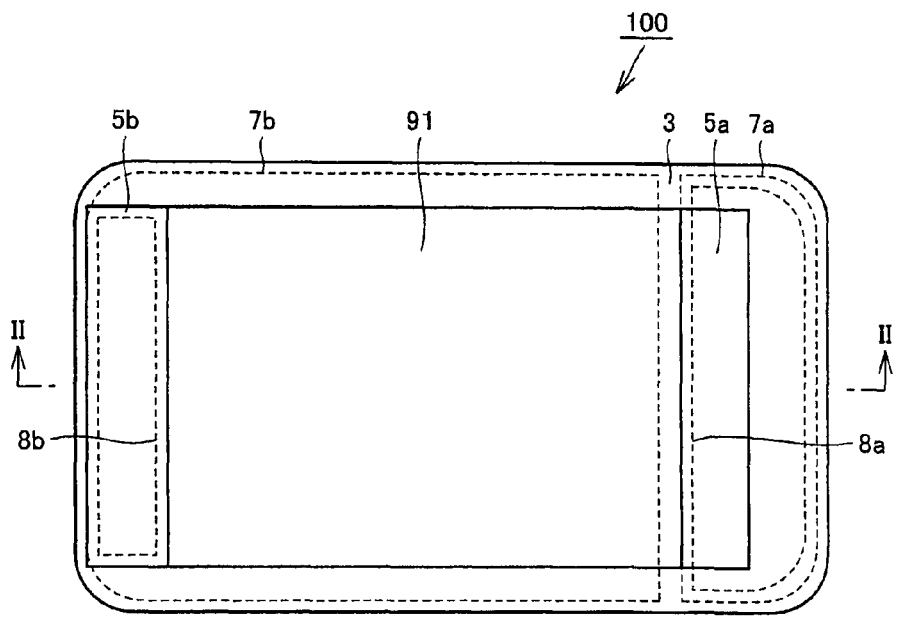
FIG. 1 is a schematic top view of a semiconductor device in a first embodiment of the present invention.
Figure 2:
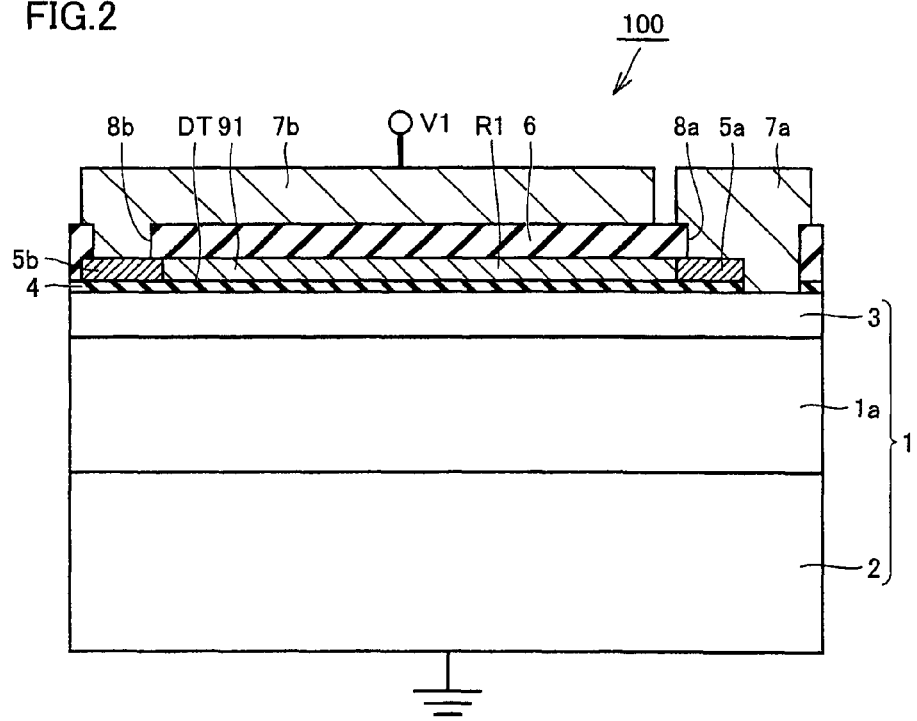
FIG. 2 is a schematic cross-sectional view taken along line II-II in FIG. 1.

Referring to FIGS. 1 and 2, a semiconductor device 100 of the present embodiment mainly has a substrate 1, a first insulating film 4, contact portions 5a and 5b, a second insulating film 6, a wiring 7a, an anode electrode pad 7b, and a channel 91.

Channel 91 and contact portions 5a and 5b configure an n-channel depletion transistor DT. Channel 91 configures a channel region of n-channel depletion transistor DT. Contact portion 5a configures a source region on the low potential side of n-channel depletion transistor DT. Contact portion 5b configures a drain region on the high potential side of n-channel depletion transistor DT. Semiconductor device 100 of the present embodiment is configured to produce a depletion layer in channel 91 of n-channel depletion transistor DT based on a gate potential.

Substrate 1 has an n⁻ impurity region 1a, a cathode diffusion layer 2 and an anode diffusion layer 3. N⁻ impurity region 1a, n-type cathode diffusion layer 2 and anode diffusion layer 3 configure a diode serving as a rectifying element D1. N-type cathode diffusion layer 2 is configured on one main surface of substrate 1. Anode diffusion layer 3 is configured on an opposite main surface of substrate 1. N⁻ impurity region 1a is configured between n-type cathode diffusion layer 2 and anode diffusion layer 3.

N⁻ impurity region 1a has an n-type impurity concentration of, for example, about $1\times10^{14}/cm^3$ and a thickness of about 200 μm. N-type impurities are diffused into n-type cathode diffusion layer 2 in a thickness of, for example, about 150 μm, and n-type cathode diffusion layer 2 has a surface concentration of, for example, $1\times10^{19}/cm^3$ or more. Anode diffusion layer 3 has a thickness of, for example, several micrometers and a surface concentration of, for example, approximately $2\times10^{17}/cm^3$.

First insulating film 4 is arranged on substrate 1. First insulating film 4 has a thickness of, for example, 200 nm. Channel 91 and contact portions 5a and 5b are arranged on first insulating film 4. Channel 91 of n-channel depletion transistor DT overlies anode diffusion layer 3 serving as an anode of rectifying element D1, with first insulating film 4 interposed therebetween. Contact portions 5a and 5b are arranged to sandwich channel 91. Channel 91 and contact portions 5a and 5b are formed of a polycrystalline silicon layer having a thickness of, for example, about 600 nm. Channel 91 has an n-type impurity concentration of, for example, $5\times10^{15}/cm^3$ to $5\times10^{17}/cm^3$. Contact portions 5a and 5b have an n-type impurity concentration of, for example, $1\times10^{19}/cm^3$ or more. Contact portions 5a and 5b configure a high concentration polycrystalline silicon layer.

Second insulating film 6 is arranged on channel 91 and contact portions 5a and 5b. Second insulating film 6 has a thickness of, for example, 800 μm. A value obtained by dividing the dielectric constant of first insulating film 4 by the thickness of first insulating film 4 is larger than a value obtained by dividing the dielectric constant of second insulating film 6 by the thickness of second insulating film 6. On second insulating film 6, wiring 7a and anode electrode pad 7b are arranged apart from each other. Channel 91 of n-channel depletion transistor DT underlies anode electrode pad 7b with second insulating film 6 interposed therebetween. Wiring 7a and anode electrode pad 7b are made of a metal such as aluminum or aluminum alloy, for example.

Contact portion 5a serving as the source region on the low potential side of n-channel depletion transistor DT is electrically connected to anode diffusion layer 3 by wiring 7a through a contact hole 8a opening to a part of the upper surface of contact portion 5a. Contact portion 5b serving as the drain region on the high potential side of n-channel depletion transistor DT is electrically connected to anode electrode pad 7b through a contact hole 8b opening to a part of the upper surface of contact portion 5b.

Channel 91 of n-channel depletion transistor DT is adjusted to obtain a resistance value corresponding to a desired transfer characteristic, using the length, the width, the thickness, and the concentration of channel 91 as parameters.

In addition, as will be described later, entire channel 91 of n-channel depletion transistor DT is not controlled by the gate voltage. A region near contact portion 5a serving as the source region of channel 91 of n-channel depletion transistor DT is configured to function as a resistance R1 as shown in FIG. 4. Resistance R1 is formed integrally with channel 91 of n-channel depletion transistor DT.

Semiconductor device 100 has a configuration in which rectifying element D1, resistance R1, n-channel depletion transistor DT, and anode electrode pad 7b are serially connected. Semiconductor device 100 is configured to generate a gate potential of n-channel depletion transistor DT based on a difference in potential across resistance R1 and to produce a depletion layer D in channel 91 of n-channel depletion transistor DT based on the gate potential.

Anode diffusion layer 3 serving as the anode of rectifying element D1, resistance R1, n-channel depletion transistor DT, and anode electrode pad 7b are serially connected in ascending order of potential.

It is noted that contact portion 5a serving as the source region of n-channel depletion transistor DT and contact portion 5b serving as the drain region are for obtaining a low-resistance ohmic contact, and even if contact portion 5a and contact portion 5b are not provided, the essential effect of the present embodiment is not impaired.

It is noted that, in semiconductor device 100, channel 91 and the like may be arranged in parallel.

Figure 3:
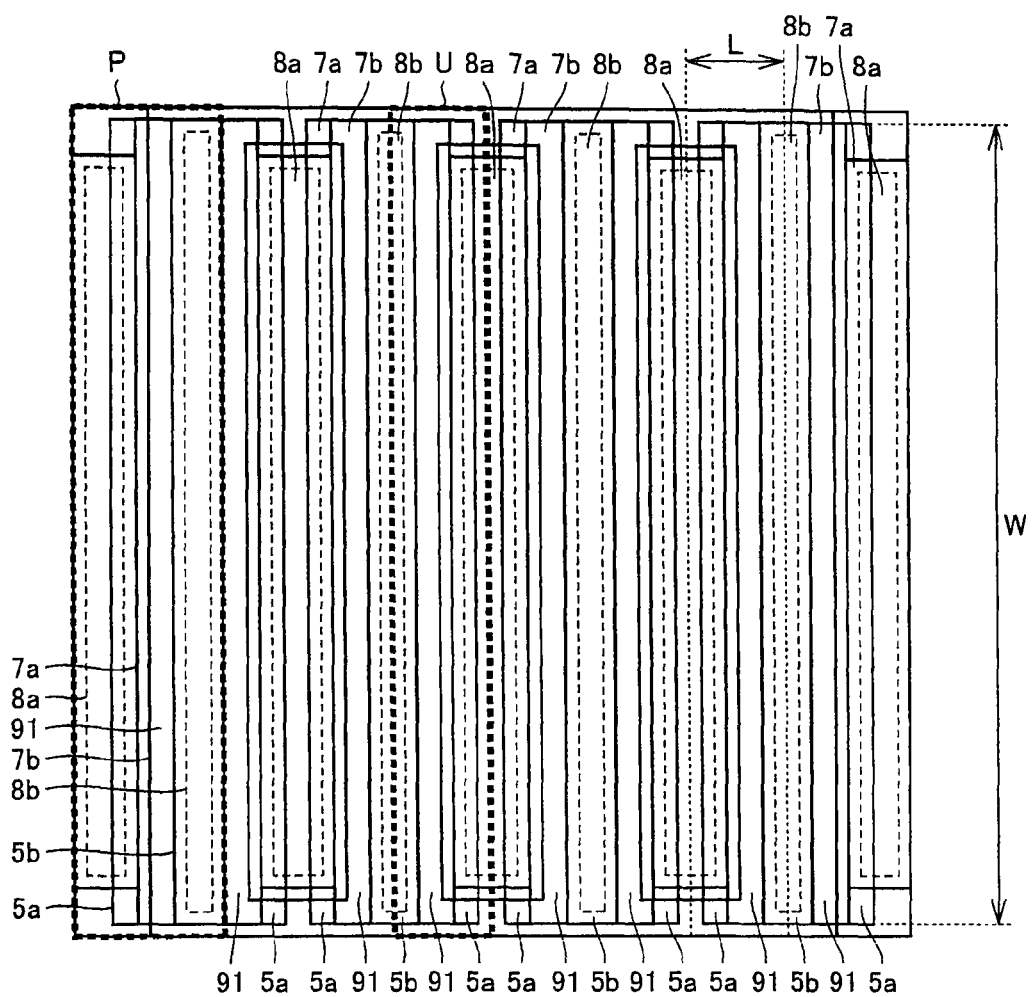
FIG. 3 is a schematic top view of the semiconductor device in the first embodiment of the present invention, in which a unit cell is arranged in parallel.

Referring to FIG. 3, a unit cell U including channel 91 and the like is arranged in parallel. A region P corresponds to the configuration shown in above FIG. 1. Assuming that channel 91 has a width W of 600 μm and a length L of 75 μm, eight unit cells Us are arranged. A total width Wt is 4800 μm, which is the sum of widths Ws of eight unit cells Us.

Next, the operation of the semiconductor device of the present embodiment will be described.

Referring to FIG. 4, in semiconductor device 100, channel 91 of n-channel depletion transistor DT is configured to have length L of 50 μm, total width Wt of 7200 μm, a thickness of 600 nm, and a concentration of $4 \times 10^{16}/cm^3$. Channel 91 of n-channel depletion transistor DT is set to generally have a resistance value of a little less than 10Ω when a voltage V1 is 15 V.

A portion corresponding to a gate of n-channel depletion transistor DT is anode diffusion layer 3 serving as the anode of the diode and anode electrode pad 7b. Anode diffusion layer 3 and anode electrode pad 7b provide input signals having a negative value or a positive value to channel 91 of n-channel depletion transistor DT, respectively, and the absolute values thereof increase as V1-V2 increases.

The potential difference between channel 91 of n-channel depletion transistor DT and anode diffusion layer 3 has a negative value in a region of channel 91 near contact portion 5a serving as the source region of n-channel depletion transistor DT, and the absolute value thereof is small. The potential difference between channel 91 of n-channel depletion transistor DT and anode diffusion layer 3 has a negative value in a region of channel 91 near contact portion 5b serving as the drain region of n-channel depletion transistor DT, and the absolute value thereof is large. The potential of anode diffusion layer 3, which is the lower one of the potential of anode diffusion layer 3 and the potential of anode electrode pad 7b, is used as the gate potential of n-channel depletion transistor DT.

Accordingly, in the region of channel 91 near contact portion 5b serving as the drain region of n-channel depletion transistor DT, depletion layer D spreads out and the channel resistance becomes high. In the region of channel 91 near contact portion 5a serving as the source region of n-channel depletion transistor DT, depletion layer D does not spread out.

On the other hand, the potential difference between channel 91 of n-channel depletion transistor DT and anode electrode pad 7b has a positive value in the region of channel 91 near contact portion 5a serving as the source region of n-channel depletion transistor DT, and the absolute value thereof is large. The potential difference between channel 91 of n-channel depletion transistor DT and anode electrode pad 7b has a positive value in the region of channel 91 near contact portion 5b serving as the drain region of n-channel depletion transistor DT, and the absolute value thereof is small.

Consequently, an accumulation layer A is formed in the region of channel 91 near contact portion 5a serving as the source region of n-channel depletion transistor DT, whereas accumulation layer A does not spread out in the region of channel 91 near contact portion 5b serving as the drain region of n-channel depletion transistor DT.

Since first insulating film 4 is thinner than second insulating film 6, the influence of n-channel depletion transistor DT that uses anode electrode pad 7b as the gate is smaller than that of n-channel depletion transistor DT that uses anode diffusion layer 3 as the gate.

Accordingly, an increase in current resulting from formation of accumulation layer A in the region of channel 91 near contact portion 5a serving as the source region of n-channel depletion transistor DT has a small influence, and the region of channel 91 near contact portion 5a serving as the source region of n-channel depletion transistor DT substantially functions as resistance R1 in accordance with the concentration of the polycrystalline silicon layer. The gate potential of n-channel depletion transistor DT is generated based on the difference in potential across resistance R1. Based on this gate potential, depletion layer D is produced in channel 91 of n-channel depletion transistor DT.

Because of the effect that depletion layer D spreads out in the region of channel 91 near contact portion 5b serving as the drain region of n-channel depletion transistor DT, the channel resistance of n-channel depletion transistor DT increases as V1-V2 increases.

It is noted that, even if first insulating film 4 is equal in thickness to second insulating film 6, the effect of the present embodiment is never lost although the effect is reduced.

Although n-channel depletion transistor DT is arranged on the anode side of the diode in the above, n-channel depletion transistor DT may be arranged on the cathode side of the diode.

Referring to FIG. 5, n-channel depletion transistor DT is arranged on cathode diffusion layer 2 with first insulating film 4 interposed therebetween. A cathode electrode pad 7b is electrically connected to n-channel depletion transistor DT. In addition, second insulating film 6 is configured to be thinner than first insulating film 4. The value obtained by dividing the dielectric constant of first insulating film 4 by the thickness of first insulating film 4 is smaller than the value obtained by dividing the dielectric constant of second insulating film 6 by the thickness of second insulating film 6. It is noted that the remaining configuration of the semiconductor device in which n-channel depletion transistor DT is arranged on the cathode side of the diode is similar to that of the above-described semiconductor device in which n-channel depletion transistor DT is arranged on the anode side of the diode. Therefore, the same components are denoted with the same reference characters and description thereof will not be repeated.

A potion corresponding to the gate of n-channel depletion transistor DT is cathode diffusion layer 2 serving as a cathode of the diode and cathode electrode pad 7b.

In the region of channel 91 near contact portion 5b serving as the drain region of n-channel depletion transistor DT, depletion layer D spreads out and the channel resistance becomes high. In the region of channel 91 near contact portion 5a serving as the source region of n-channel depletion transistor DT, depletion layer D does not spread out.

Accumulation layer A is formed in the region of channel 91 near contact portion 5a serving as the source region of n-channel depletion transistor DT, whereas accumulation layer A does not spread out in the region of channel 91 near contact portion 5b serving as the drain region of n-channel depletion transistor DT.

The increase in current resulting from formation of accumulation layer A in the region of channel 91 near contact portion 5a serving as the source region of n-channel depletion transistor DT has a small influence, and the region of channel 91 near contact portion 5a serving as the source region of n-channel depletion transistor DT substantially functions as resistance R1 in accordance with the concentration of the polycrystalline silicon layer.

Next, the operation and effect of the semiconductor device of the present embodiment will be described in comparison with a semiconductor device of a comparative example.

Figure 6:
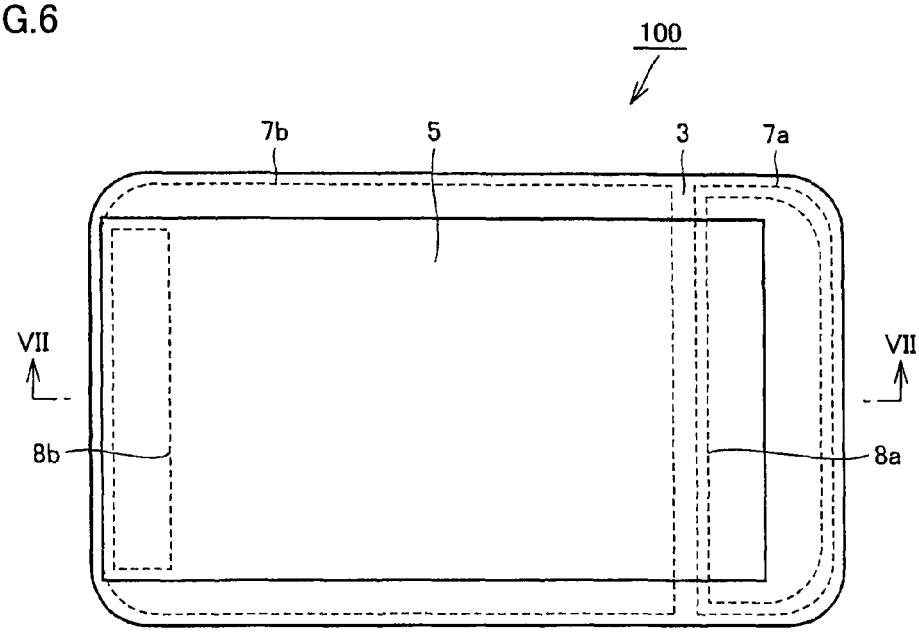
FIG. 6 is a schematic top view of a semiconductor device of a comparative example.
Figure 7:
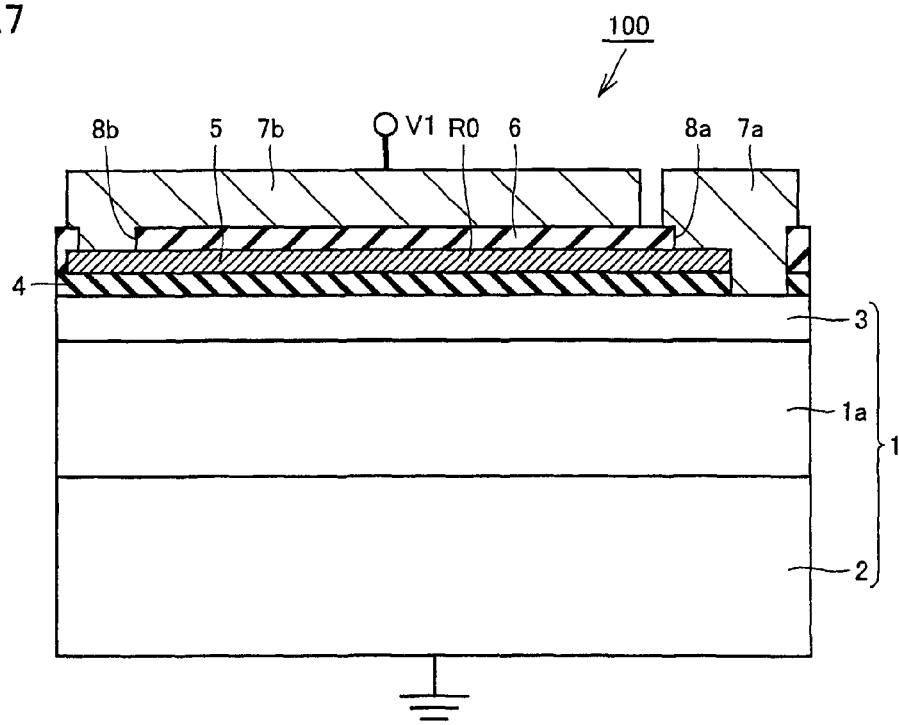
FIG. 7 is a schematic cross-sectional view taken along line VII-VII in FIG. 6.

Referring to FIGS. 6 and 7, semiconductor device 100 of the comparative example is different from semiconductor device 100 of the first embodiment mainly in that semiconductor device 100 of the comparative example does not have n-channel depletion transistor DT. In semiconductor device 100 of the comparative example, first insulating film 4 has a thickness of 600 nm. Second insulating film 6 has a thickness of about 1 μm. A resistance layer 5 is arranged between first insulating film 4 and second insulating film 6. Resistance layer 5 has an impurity concentration of $1\times10^{19}/cm^3$ or more and a thickness of about 1 to 2 μm. Resistance layer 5 configures a high concentration polycrystalline silicon resistance layer.

Resistance layer 5 is adjusted to obtain a desired resistance value, using the length, the width, the thickness, and the concentration of resistance layer 5 as parameters. It is noted that the remaining configuration of semiconductor device 100 of the comparative example is similar to that of the above first embodiment. Therefore, the same components are denoted with the same reference characters and description thereof will not be repeated.

Figure 8:
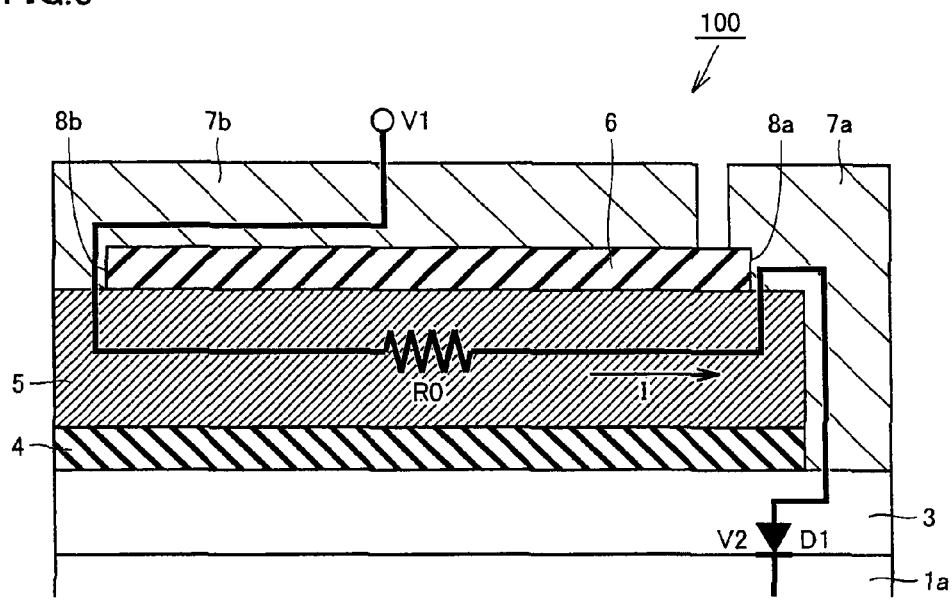
FIG. 8 schematically illustrates a cross-sectional structure on the anode side of the semiconductor device of the comparative example and an equivalent circuit thereof.

Referring to FIG. 8, in semiconductor device 100 of the comparative example, resistance layer 5 is configured to have length L of 600 μm, width W of 600 μm, a thickness of 600 nm, and a concentration of $1\times10^{20}/cm^3$. Resistance layer 5 is set to generally have a resistance value of a little less than 10Ω.

If voltage V2 between the anode and the cathode of the diode becomes high, a current increases significantly. As for the entire element, however, the increase is limited by a resistance R0 of about 10Ω and a current that is equal to or larger than V1/R0 never flows. Accordingly, by setting resistance R0 to have a resistance value (V2<<V1) that is sufficiently higher than that of the resistance of the diode at a desired current value, the rate of increase in current in a high-voltage region can be kept almost constant.

In semiconductor device 100 of the comparative example, although the resistance value of the entire element approaches the resistance value of resistance R0 with increase in voltage, the resistance value never falls below the resistance value of resistance R0. Therefore, when voltage V1 is further applied, a current corresponding to almost V1/R0 flows. In other words, although the diode suppresses the current, the diode does not have a current-limiting function.

Figure 9:
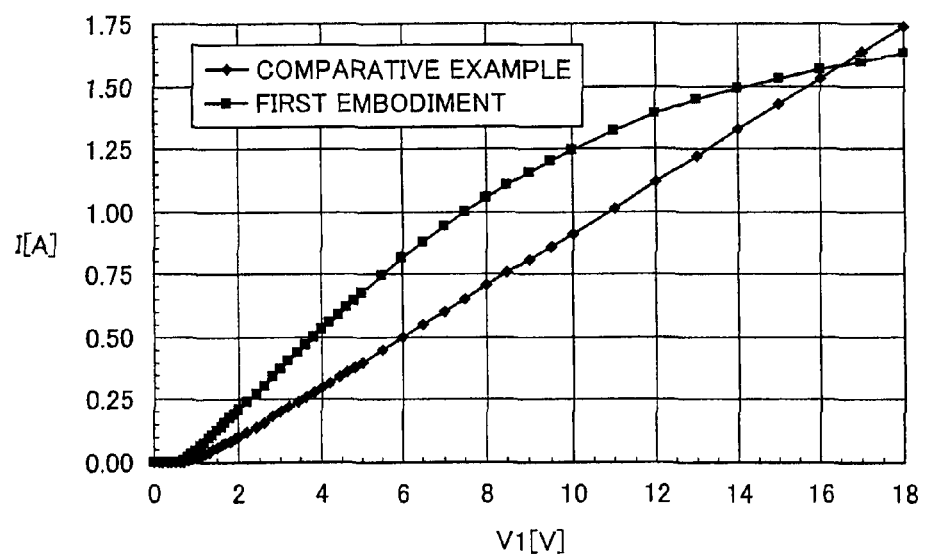
FIG. 9 illustrates the voltage-current characteristics of the semiconductor device in the first embodiment of the present invention and the semiconductor device of the comparative example.

Referring to FIG. 9, the voltage-current characteristic is illustrated when, as to semiconductor device 100 of the comparative example, an initial maximum voltage Vmax during power-on is estimated as 15 V and a maximum current Imax at this time is set to 1.5 A or smaller, for example. For example, when voltage V1 of 18 V is applied due to an unexpected surge and the like, a current of 1.75 A (increased by about 25% as compared with the current at Vmax) flows.

Furthermore, assuming that a current I1 during the normal operation is, for example, approximately 0.25 A, a voltage at this time is $V1 \approx R0 \times I1 + \Delta V$, where $\Delta V$ is the work function difference of a junction of the diode. In this case, application of the voltage of about 3.5 V is required.

Here, since $R0 \approx Vmax/Imax$, $V1 \approx Vmax \times I1/Imax + \Delta V$, and it is difficult to decrease V1 during the normal operation.

Referring to FIG. 9, the voltage-current characteristic is illustrated when, as to semiconductor device 100 of the present embodiment, maximum voltage Vmax is set to 15 V and maximum current Imax is set to about 1.5 A, for example. For example, when voltage V1 of 18 V is applied, the increase in current is approximately 9%, which is significantly smaller than about 25% in the comparative example. Therefore, semiconductor device 100 of the present embodiment has the current-limiting function. In other words, even when the voltage during power-on exceeds Vmax, the increase in current can be made smaller than Imax. This current-limiting function is due to depletion layer D.

In addition, assuming that current I1 during the normal operation is, for example, approximately 0.25 A, voltage V1 at this time is approximately 2.2 V, which is significantly smaller than 3.5 V in the comparative example. In other words, $V1 < Vmax \times I1/Imax + \Delta V$ can be achieved during the normal operation.

According to semiconductor device 100 of the present embodiment, there can be provided a semiconductor device having reasonably large current at low voltage and small current at high voltage because the semiconductor device is configured to produce depletion layer D in channel 91 of n-channel depletion transistor DT based on the gate potential.

In semiconductor device 100 of the present embodiment, by a combination for setting the concentration of channel 91 of n-channel depletion transistor DT to be low, voltage V1 can be set to be low with maximum current Imax remaining constant. In other words, the above combination is a combination for allowing a reduction in resistivity of channel 91, and a combination for increasing the thickness of channel 91, raising the concentration of contact portions 5a and 5b, shortening the length of channel 91, and shortening the length (increasing the total width) of the unit cell. The concentration of channel 91 can be set to $2\times10^{18}/cm^3$.

In addition, according to semiconductor device 100 of the present embodiment, the potential of anode diffusion layer 3, which is the lower one of the potential of anode diffusion layer 3 and the potential of anode electrode pad 7b, is used as the gate potential of n-channel depletion transistor DT. Therefore, there can be provided a semiconductor device having reasonably large current at low voltage and small current at high voltage.

Furthermore, according to semiconductor device 100 of the present embodiment, anode diffusion layer 3 serving as the anode of rectifying element D1, resistance R1, n-channel depletion transistor DT, and anode electrode pad 7b are serially connected in ascending order of potential. Channel 91 of n-channel depletion transistor DT overlies anode diffusion layer 3 serving as the anode of rectifying element D1, with first insulating film 4 interposed therebetween, and underlies anode electrode pad 7b with second insulating film 6 interposed therebetween. Semiconductor device 100 is configured such that the value obtained by dividing the dielectric constant of first insulating film 4 by the thickness of first insulating film 4 is larger than the value obtained by dividing the dielectric constant of second insulating film 6 by the thickness of second insulating film 6. Therefore, there can be provided a semiconductor device having reasonably large current at low voltage and small current at high voltage.

Moreover, according to semiconductor device 100 of the present embodiment, cathode diffusion layer 2 serving as the cathode of rectifying element D1, n-channel depletion transistor DT, resistance R1, and cathode electrode pad 7b are serially connected in descending order of potential. Channel 91 of n-channel depletion transistor DT overlies cathode diffusion layer 2 serving as the cathode of rectifying element D1, with first insulating film 4 interposed therebetween, and underlies cathode electrode pad 7b with second insulating film 6 interposed therebetween. Semiconductor device 100 is configured such that the value obtained by dividing the dielectric constant of first insulating film 4 by the thickness of first insulating film 4 is smaller than the value obtained by dividing the dielectric constant of second insulating film 6 by the thickness of second insulating film 6. Therefore, there can be provided a semiconductor device having reasonably large current at low voltage and small current at high voltage.

Additionally, according to semiconductor device 100 of the present embodiment, resistance R1 is formed integrally with channel 91 of n-channel depletion transistor DT. Therefore, production efficiency can be improved.

Second Embodiment

A semiconductor device according to a second embodiment of the present invention is different from the semiconductor device of the first embodiment mainly in that the semiconductor device of the second embodiment has a p-channel depletion transistor.

Figure 10:
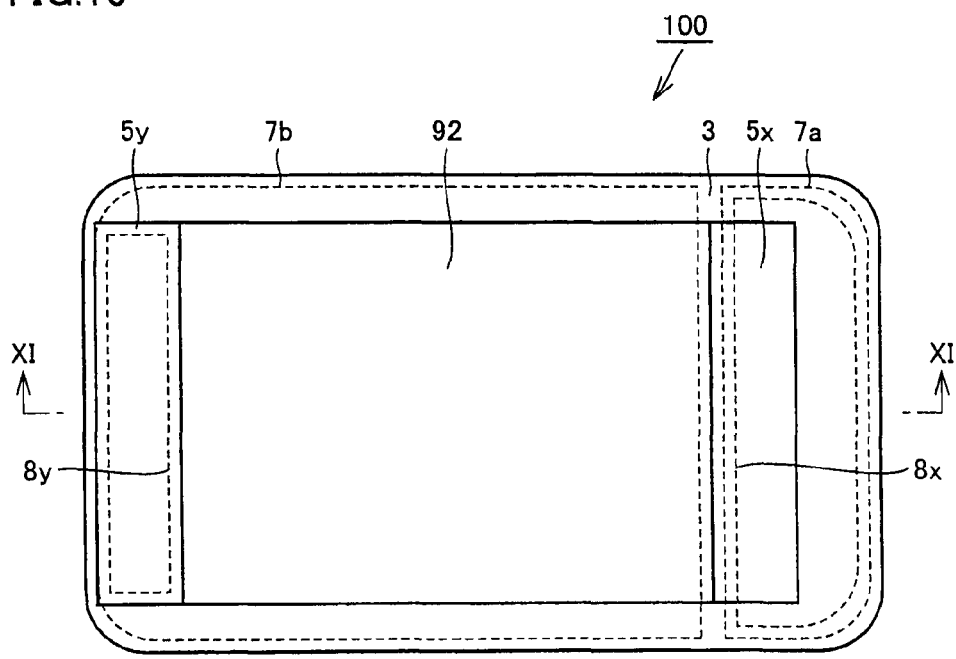
FIG. 10 is a schematic top view of a semiconductor device in a second embodiment of the present invention.
Figure 11:
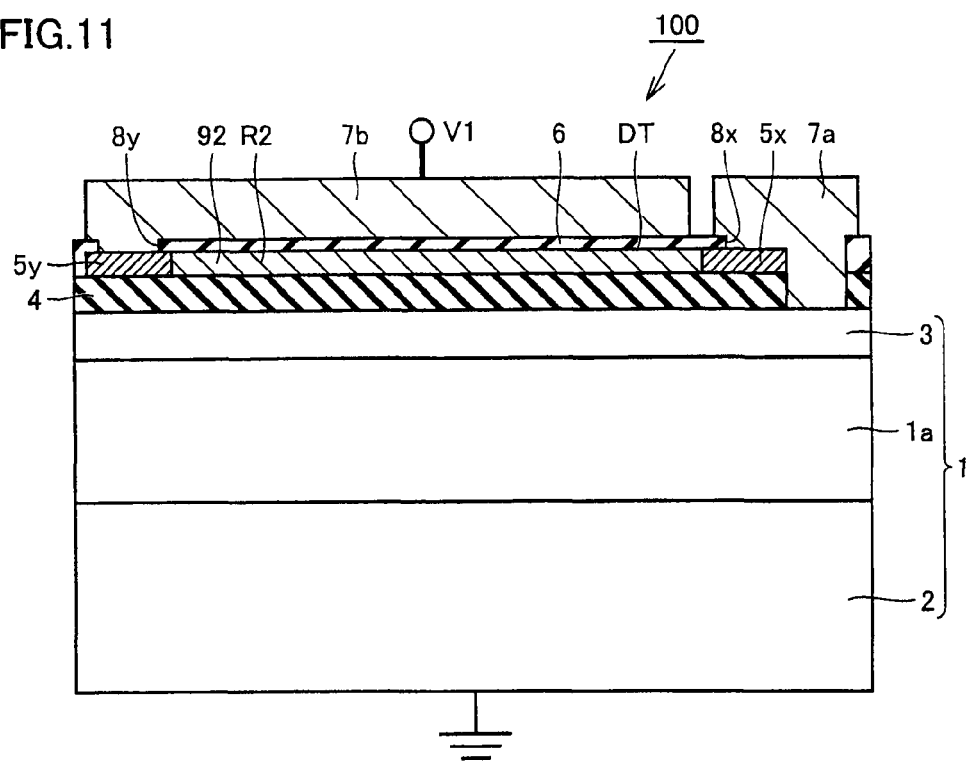
FIG. 11 is a schematic cross-sectional view taken along line XI-XI in FIG. 10.

Referring to FIGS. 10 and 11, a channel 92 and contact portions 5x and 5y configure a p-channel depletion transistor DT. Semiconductor device 100 of the present embodiment is configured to produce the depletion layer in channel 92 of p-channel depletion transistor DT based on the gate potential.

First insulating film 4 is arranged on substrate 1. First insulating film 4 has a thickness of, for example, 800 nm. Channel 92 and contact portions 5x and 5y are arranged on first insulating film 4. Channel 92 of p-channel depletion transistor DT overlies anode diffusion layer 3 serving as the anode of rectifying element D1, with first insulating film 4 interposed therebetween. Contact portions 5x and 5y are arranged to sandwich channel 92. Channel 92 and contact portions 5x and 5y are formed of the polycrystalline silicon layer having a thickness of, for example, about 600 nm. Channel 92 has a p-type impurity concentration of, for example, $5 \times 10^{15}/cm^3$ to $5 \times 10^{17}/cm^3$. Contact portions 5x and 5y have a p-type impurity concentration of, for example, $1 \times 10^{19}/cm^3$ or more. Contact portions 5x and 5y configure the high concentration polycrystalline silicon layer.

Second insulating film 6 is arranged on channel 92 and contact portions 5x and 5y. Second insulating film 6 has a thickness of, for example, 200 μm. The value obtained by dividing the dielectric constant of second insulating film 6 by the thickness of second insulating film 6 is larger than the value obtained by dividing the dielectric constant of first insulating film 4 by the thickness of first insulating film 4. On second insulating film 6, wiring 7a and anode electrode pad 7b are arranged apart from each other. Channel 92 of p-channel depletion transistor DT underlies anode electrode pad 7b with second insulating film 6 interposed therebetween.

Contact portion 5x serving as a drain region on the low potential side of p-channel depletion transistor DT is electrically connected to anode diffusion layer 3 by wiring 7a through a contact hole 8x opening to a part of the upper surface of contact portion 5x. Contact portion 5y serving as a source region on the high potential side of p-channel depletion transistor DT is electrically connected to anode electrode pad 7b through a contact hole 8y opening to a part of the upper surface of contact portion 5y.

Channel 92 of p-channel depletion transistor DT is adjusted to obtain a resistance value corresponding to a desired transfer characteristic, using the length, the width, the thickness, and the concentration of channel 92 as parameters.

Figure 12:
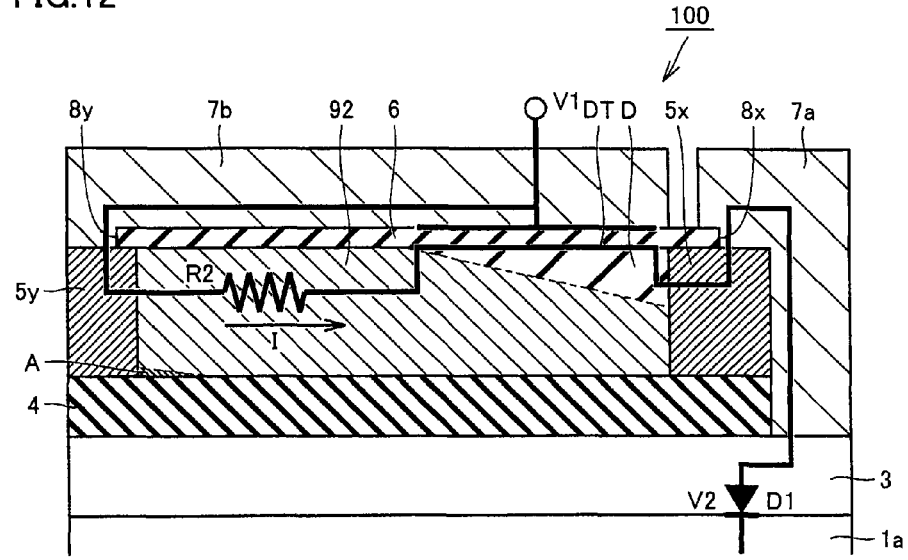
FIG. 12 schematically illustrates a cross-sectional structure on the anode side of the semiconductor device in the second embodiment of the present invention and an equivalent circuit thereof.

In addition, as will be described later, entire channel 92 of p-channel depletion transistor DT is not controlled by the gate voltage. A region near contact portion 5y serving as the source region of channel 92 of p-channel depletion transistor DT is configured to function as a resistance R2 as shown in FIG. 12. Resistance R2 is formed integrally with channel 92 of p-channel depletion transistor DT.

Semiconductor device 100 has a configuration in which rectifying element D1, resistance R2, p-channel depletion transistor DT, and anode electrode pad 7b are serially connected. Semiconductor device 100 is configured to generate a gate potential of p-channel depletion transistor DT based on a difference in potential across resistance R2 and to produce depletion layer D in channel 92 of p-channel depletion transistor DT based on the gate potential.

Anode diffusion layer 3 serving as the anode of rectifying element D1, p-channel depletion transistor DT, resistance R2, and anode electrode pad 7b are serially connected in ascending order of potential.

It is noted that contact portion 5x serving as the drain region of p-channel depletion transistor DT and contact portion 5y serving as the source region are for obtaining a low-resistance ohmic contact, and even if contact portion 5x and contact portion 5y are not provided, the essential effect of the present embodiment is not impaired.

It is noted that the remaining configuration of semiconductor device 100 of the second embodiment is similar to that of the above first embodiment. Therefore, the same components are denoted with the same reference characters and description thereof will not be repeated.

Next, the operation of the semiconductor device of the present embodiment will be described.

Referring to FIG. 12, in semiconductor device 100, channel 92 of p-channel depletion transistor DT is configured to have length L of 50 μm, total width Wt of 7200 μm, a thickness of 600 nm, and a concentration of $4 \times 10^{16}/cm^3$. Channel 92 of p-channel depletion transistor DT is set to generally have a resistance value of a little less than 10Ω when voltage V1 is 15 V.

A portion corresponding to a gate of p-channel depletion transistor DT is anode diffusion layer 3 serving as the anode of the diode and anode electrode pad 7b. Anode diffusion layer 3 and anode electrode pad 7b provide input signals having a negative value or a positive value to channel 92 of p-channel depletion transistor DT, respectively, and the absolute values thereof increase as V1-V2 increases.

The potential difference between channel 92 of p-channel depletion transistor DT and anode electrode pad 7b has a positive value in a region of channel 92 near contact portion 5y serving as the source region of p-channel depletion transistor DT, and the absolute value thereof is small. The potential difference between channel 92 of p-channel depletion transistor DT and anode electrode pad 7b has a positive value in a region of channel 92 near contact portion 5x serving as the drain region of p-channel depletion transistor DT, and the absolute value thereof is large. The potential of anode electrode pad 7b, which is the higher one of the potential of anode diffusion layer 3 and the potential of anode electrode pad 7b, is used as the gate potential of p-channel depletion transistor DT.

Accordingly, in the region of channel 92 near contact portion 5x serving as the drain region of p-channel depletion transistor DT, depletion layer D spreads out and the channel resistance becomes high. In the region of channel 92 near contact portion 5y serving as the source region of p-channel depletion transistor DT, depletion layer D does not spread out.

On the other hand, the potential difference between channel 92 of p-channel depletion transistor DT and anode diffusion layer 3 has a negative value in the region of channel 92 near contact portion 5y serving as the source region of p-channel depletion transistor DT, and the absolute value thereof is large. The potential difference between channel 92 of p-channel depletion transistor DT and anode diffusion layer 3 has a negative value in the region of channel 92 near contact portion 5x serving as the drain region of p-channel depletion transistor DT, and the absolute value thereof is small.

Consequently, accumulation layer A is formed in the region of channel 92 near contact portion 5y serving as the source region of p-channel depletion transistor DT, whereas accumulation layer A does not spread out in the region of channel 92 near contact portion 5x serving as the drain region of p-channel depletion transistor DT.

Since first insulating film 4 is thicker than second insulating film 6, the influence of p-channel depletion transistor DT that uses anode diffusion layer 3 as the gate is smaller than that of p-channel depletion transistor DT that uses anode electrode pad 7b as the gate.

Accordingly, an increase in current resulting from formation of accumulation layer A in the region of channel 92 near contact portion 5y serving as the source region of p-channel depletion transistor DT has a small influence, and the region of channel 92 near contact portion 5y serving as the source region of p-channel depletion transistor DT substantially functions as resistance R2 in accordance with the concentration of the polycrystalline silicon layer. The gate potential of p-channel depletion transistor DT is generated based on the difference in potential across resistance R2. Based on this gate potential, depletion layer D is produced in channel 92 of p-channel depletion transistor DT.

Because of the effect that depletion layer D spreads out in the region of channel 92 near contact portion 5x serving as the drain region of p-channel depletion transistor DT, the channel resistance of p-channel depletion transistor DT increases as V1-V2 increases.

It is noted that, even if first insulating film 4 is equal in thickness to second insulating film 6, the effect of the present embodiment is never lost although the effect is reduced.

Although p-channel depletion transistor DT is arranged on the anode side of the diode in the above, p-channel depletion transistor DT may be arranged on the cathode side of the diode.

Figure 13:
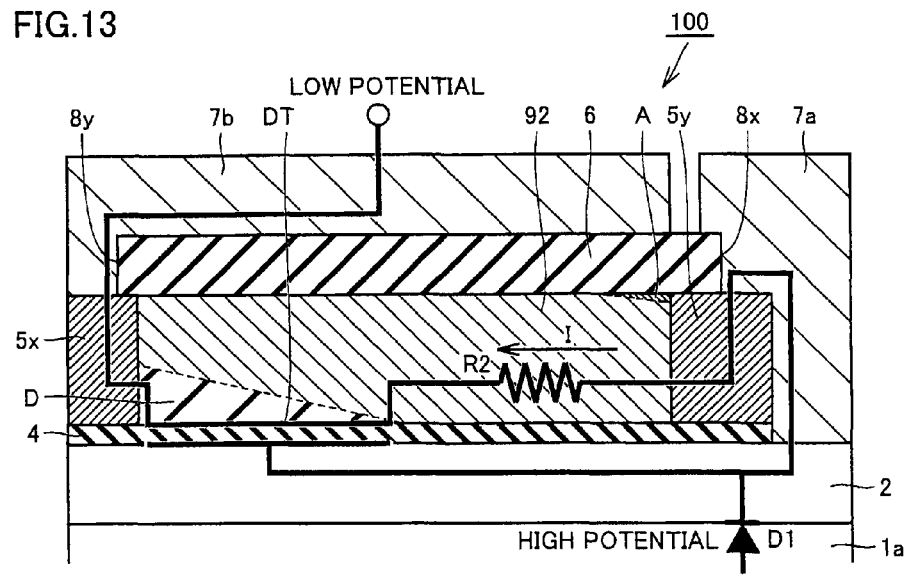
FIG. 13 schematically illustrates a cross-sectional structure on the cathode side of the semiconductor device in the second embodiment of the present invention and an equivalent circuit thereof.

Referring to FIG. 13, p-channel depletion transistor DT is arranged on cathode diffusion layer 2 with first insulating film 4 interposed therebetween. Cathode electrode pad 7b is electrically connected to p-channel depletion transistor DT. In addition, first insulating film 4 is configured to be thinner than second insulating film 6. The value obtained by dividing the dielectric constant of second insulating film 6 by the thickness of second insulating film 6 is smaller than the value obtained by dividing the dielectric constant of first insulating film 4 by the thickness of first insulating film 4. It is noted that the remaining configuration of the semiconductor device in which p-channel depletion transistor DT is arranged on the cathode side of the diode is similar to that of the above-described semiconductor device in which p-channel depletion transistor DT is arranged on the anode side of the diode. Therefore, the same components are denoted with the same reference characters and description thereof will not be repeated.

A potion corresponding to the gate of p-channel depletion transistor DT is cathode diffusion layer 2 serving as the cathode of the diode and cathode electrode pad 7b.

In the region of channel 92 near contact portion 5x serving as the drain region of p-channel depletion transistor DT, depletion layer D spreads out and the channel resistance becomes high. In the region of channel 92 near contact portion 5y serving as the source region of p-channel depletion transistor DT, depletion layer D does not spread out.

Accumulation layer A is formed in the region of channel 92 near contact portion 5y serving as the source region of p-channel depletion transistor DT, whereas accumulation layer A does not spread out in the region of channel 92 near contact portion 5x serving as the drain region of p-channel depletion transistor DT.

The increase in current resulting from formation of accumulation layer A in the region of channel 92 near contact portion 5y serving as the source region of p-channel depletion transistor DT has a small influence, and the region of channel 92 near contact portion 5y serving as the source region of p-channel depletion transistor DT substantially functions as resistance R2 in accordance with the concentration of the polycrystalline silicon layer.

According to semiconductor device 100 of the present embodiment, there can be provided a semiconductor device having reasonably large current at low voltage and small current at high voltage because the semiconductor device is configured to produce depletion layer D in channel 92 of p-channel depletion transistor DT based on the gate potential.

In semiconductor device 100 of the present embodiment, by a combination for setting the concentration of channel 92 of p-channel depletion transistor DT to be low, voltage V1 can be set to be low with maximum current Imax remaining constant. In other words, the above combination is a combination for allowing a reduction in resistivity of channel 92, and a combination for increasing the thickness of channel 92, raising the concentration of contact portions 5x and 5y, shortening the length of channel 92, and shortening the length (increasing the total width) of the unit cell. The concentration of channel 92 can be set to $2\times10^{18}/cm^3$.

In addition, according to semiconductor device 100 of the present embodiment, the potential of anode electrode pad 7b, which is the higher one of the potential of anode diffusion layer 3 and the potential of anode electrode pad 7b, is used as the gate potential of p-channel depletion transistor DT. Therefore, there can be provided a semiconductor device having reasonably large current at low voltage and small current at high voltage.

Furthermore, according to semiconductor device 100 of the present embodiment, anode diffusion layer 3 serving as the anode of rectifying element D1, p-channel depletion transistor DT, resistance R2, and anode electrode pad 7b are serially connected in ascending order of potential. Channel 92 of p-channel depletion transistor DT underlies anode electrode pad 7b of rectifying element D1 with second insulating film 6 interposed therebetween, and overlies anode diffusion layer 3 serving as the anode of rectifying element D1, with first insulating film 4 interposed therebetween. Semiconductor device 100 is configured such that the value obtained by dividing the dielectric constant of second insulating film 6 by the thickness of second insulating film 6 is larger than the value obtained by dividing the dielectric constant of first insulating film 4 by the thickness of first insulating film 4. Therefore, there can be provided a semiconductor device having reasonably large current at low voltage and small current at high voltage.

Moreover, according to semiconductor device 100 of the present embodiment, cathode diffusion layer 2 serving as the cathode of rectifying element D1, resistance R2, p-channel depletion transistor DT, and cathode electrode pad 7b are serially connected in descending order of potential. Channel 92 of p-channel depletion transistor DT underlies cathode electrode pad 7b with second insulating film 6 interposed therebetween, and overlies cathode diffusion layer 2 serving as the cathode of rectifying element D1, with first insulating film 4 interposed therebetween. Semiconductor device 100 is configured such that the value obtained by dividing the dielectric constant of second insulating film 6 by the thickness of second insulating film 6 is smaller than the value obtained by dividing the dielectric constant of first insulating film 4 by the thickness of first insulating film 4. Therefore, there can be provided a semiconductor device having reasonably large current at low voltage and small current at high voltage.

Additionally, according to semiconductor device 100 of the present embodiment, resistance R2 is formed integrally with channel 92 of p-channel depletion transistor DT. Therefore, production efficiency can be improved.

Third Embodiment

A semiconductor device of a third embodiment of the present invention is different from the semiconductor device of the first embodiment mainly in terms of the length of the channel of the n-channel depletion transistor.

Figure 14:
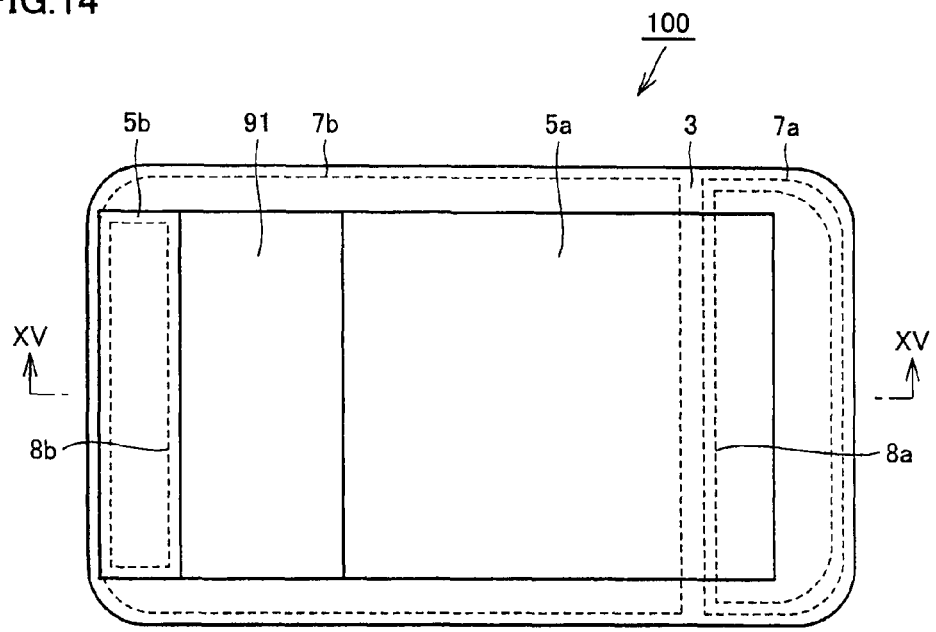
FIG. 14 is a schematic top view of a semiconductor device in a third embodiment of the present invention.
Figure 15:
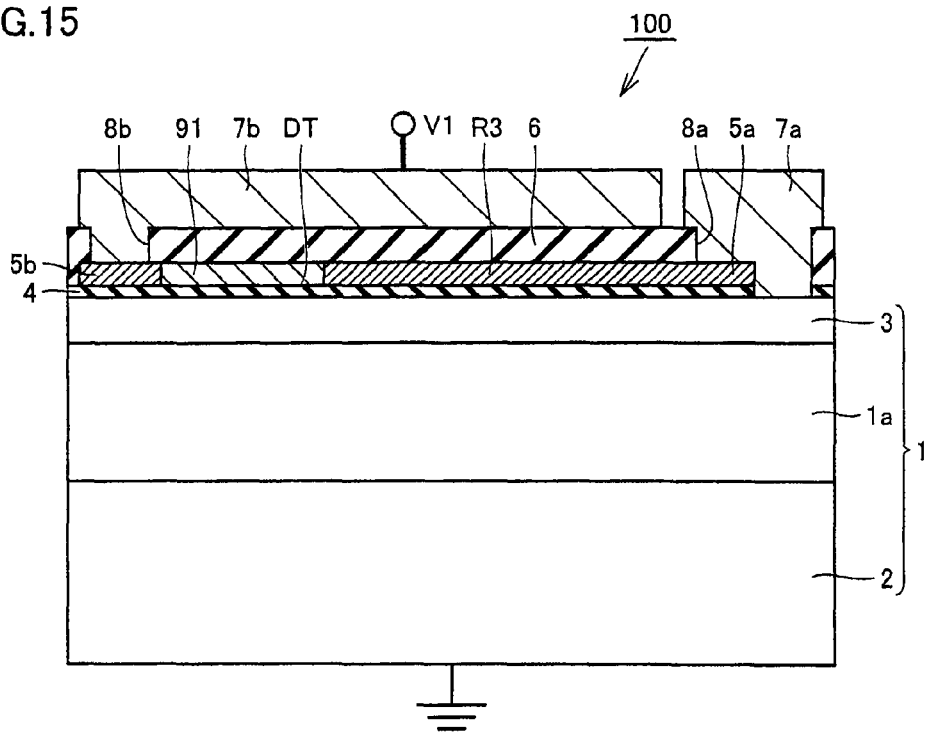
FIG. 15 is a schematic cross-sectional view taken along line XV-XV in FIG. 14.
Figure 16:
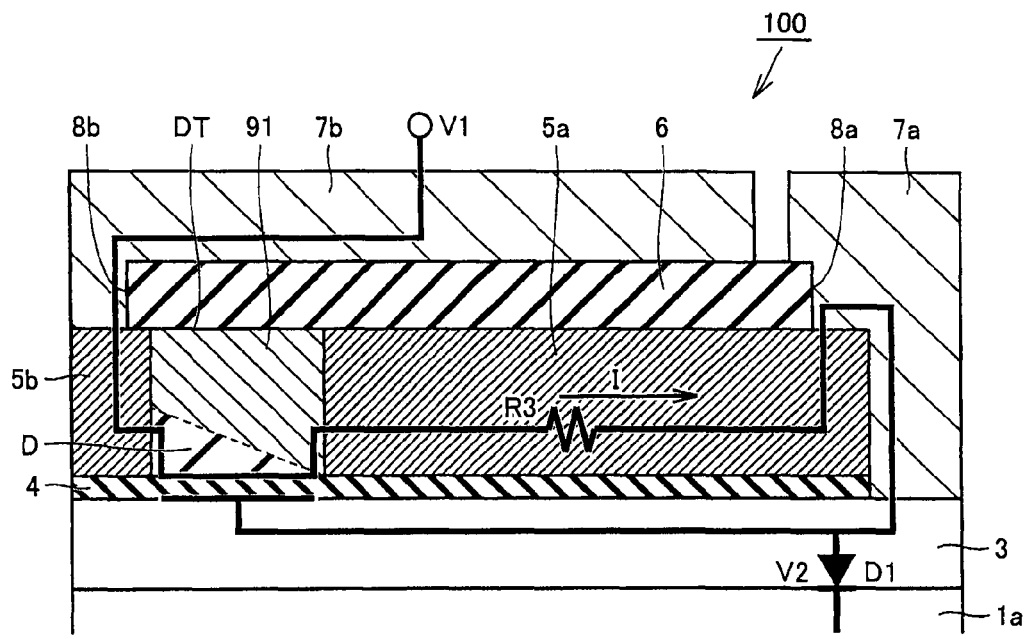
FIG. 16 schematically illustrates a cross-sectional structure on the anode side of the semiconductor device in the third embodiment of the present invention and an equivalent circuit thereof.

Referring to FIGS. 14 and 15, channel 91 is configured to be shorter than contact portion 5a that configures the source region on the low potential side of n-channel depletion transistor DT. Contact portion 5a is configured to be long to have a constant resistance R3 as shown in FIG. 16. Resistance R3 is formed integrally with contact portion 5a serving as the source of n-channel depletion transistor DT. Contact portions 5a and 5b of n-channel depletion transistor DT have an n-type impurity concentration of, for example, about $1 \times 10^{18}/cm^3$ or more. The impurity concentration of a portion of contact portion 5a other than a portion that is in contact with wiring 7a may be lower than that of the portion that is in contact with wiring 7a. In addition, the impurity concentration of the portion of contact portion 5a other than the portion that is in contact with wiring 7a may be lower than that of contact portion 5b.

It is noted that the remaining configuration of semiconductor device 100 of the third embodiment is similar to that of the above first embodiment. Therefore, the same components are denoted with the same reference characters and description thereof will not be repeated.

Next, the operation of the semiconductor device of the present embodiment will be described.

Referring to FIG. 16, in semiconductor device 100, channel 91 of n-channel depletion transistor DT is configured to have length L of 10 μm, total width Wt of 3000 μm, a thickness of 600 nm, and a concentration of $4 \times 10^{16}/cm^3$. Contact portion 5b is configured to have a length of 90 μm. Channel 91 of n-channel depletion transistor DT is set to generally have a resistance value of a little less than 10Ω when voltage V1 is 15 V.

As to the potential difference between channel 91 of n-channel depletion transistor DT and anode diffusion layer 3, the potential of an interface between channel 91 and contact portion 5a that configures the source region on the low potential side of n-channel depletion transistor DT is higher than that of V2 by resistance R3×current I. Therefore, the potential difference between the source side and the drain side of channel 91 becomes small, and thus, almost entire channel 91 undergoes depletion. Accordingly, depletion layer D spreads out in almost entire channel 91 of n-channel depletion transistor DT, and thus, the channel resistance becomes high.

On the other hand, as to the potential difference between channel 91 of n-channel depletion transistor DT and anode electrode pad 7b, the potential of the interface between channel 91 and contact portion 5a that configures the source region on the low potential side of n-channel depletion transistor DT is higher than that of V2 by resistance R3×current I. Therefore, the potential difference between the source side and the drain side of channel 91 becomes small, and contact portion 5a serves as a region having a large potential difference between channel 91 of n-channel depletion transistor DT and anode electrode pad 7b.

Consequently, accumulation layer A does not spread out in the region of channel 91 near contact portion 5b serving as the drain region of n-channel depletion transistor DT, and accumulation layer A does not spread out in the region of channel 91 near contact portion 5a serving as the source region of n-channel depletion transistor DT, either.

Figure 17:
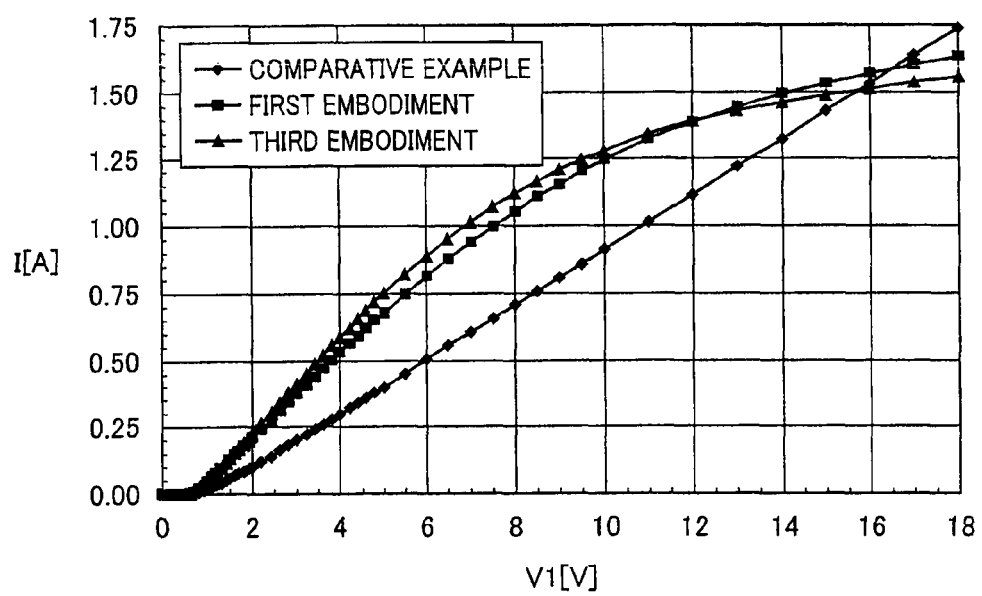
FIG. 17 illustrates the voltage-current characteristics of the semiconductor device in the third embodiment of the present invention, the semiconductor device in the first embodiment of the present invention, and the semiconductor device of the comparative example.

Referring to FIG. 17, the voltage-current characteristic is illustrated when, as to semiconductor device 100 of the present embodiment, maximum voltage Vmax is set to 15 V and maximum current Imax is set to about 1.5 A. For example, when voltage V1 of 18 V is applied, an increase in current is approximately 5%, which is smaller than that of the first embodiment. Therefore, semiconductor device 100 of the present embodiment can enhance the current-limiting function, as compared with the semiconductor device of the first embodiment.

In addition, assuming that current I1 during the normal operation is, for example, approximately 0.25 A, voltage V1 at this time is approximately 2.1 V, which can be equal to or lower than that of the first embodiment.

According to semiconductor device 100 of the present embodiment, the resistivity of a region that does not contribute to depletion is suppressed to be lower than that of semiconductor device 100 of the first embodiment, and thus, the resistance at low voltage can be lowered when semiconductor device 100 of the present embodiment has the equal current-limiting effect at high voltage.

In addition, according to semiconductor device 100 of the present embodiment, resistance R3 is formed integrally with contact portion 5a serving as the source of n-channel depletion transistor DT. Therefore, production efficiency can be improved.

Fourth Embodiment

A semiconductor device of a fourth embodiment of the present invention is different from the semiconductor device of the second embodiment mainly in terms of the length of the channel of the p-channel depletion transistor.

Figure 18:
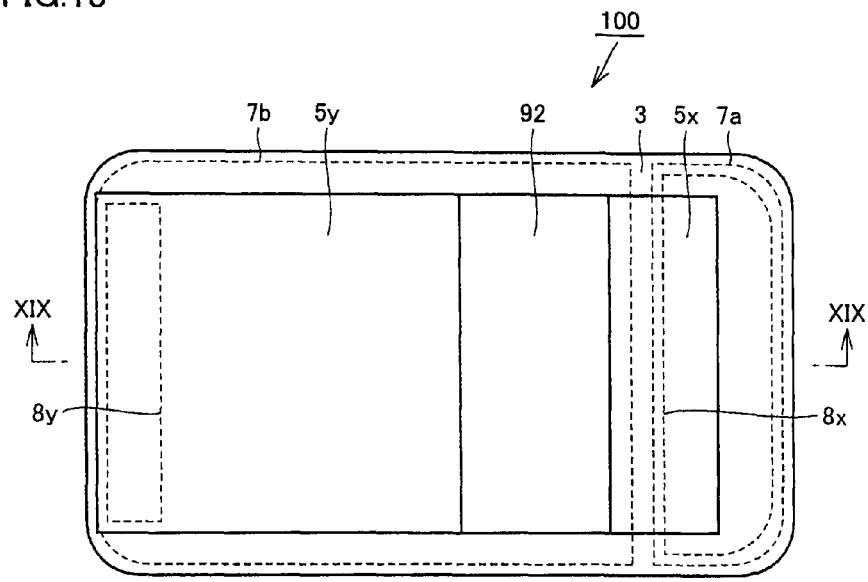
FIG. 18 is a schematic top view of a semiconductor device in a fourth embodiment of the present invention.
Figure 19:
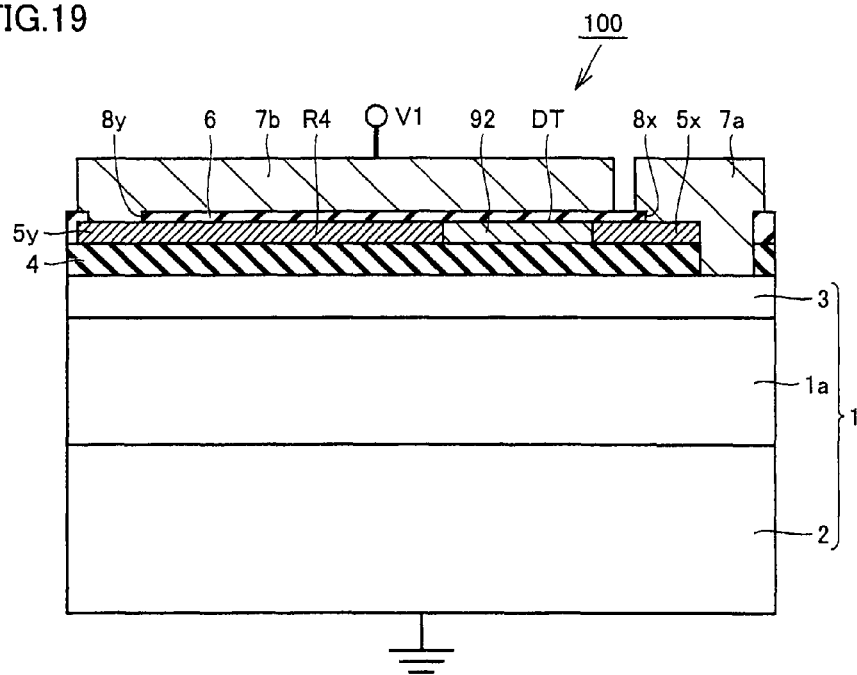
FIG. 19 is a schematic cross-sectional view taken along line XIX-XIX in FIG. 18.
Figure 20:
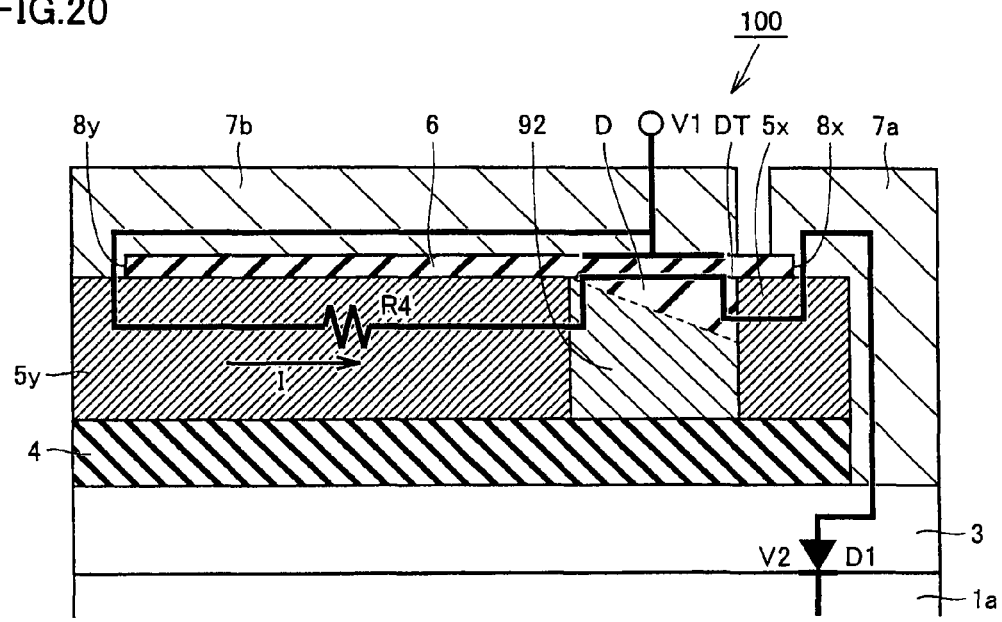
FIG. 20 schematically illustrates a cross-sectional structure on the anode side of the semiconductor device in the fourth embodiment of the present invention and an equivalent circuit thereof.

Referring to FIGS. 18 and 19, channel 92 is configured to be shorter than contact portion 5y that configures the source region on the high potential side of p-channel depletion transistor DT. Contact portion 5y is configured to be long to have a constant resistance R4 as shown in FIG. 20. Resistance R4 is formed integrally with contact portion 5y serving as the source of p-channel depletion transistor DT. Contact portions 5x and 5y of p-channel depletion transistor DT have a p-type impurity concentration of, for example, about $1\times10^{18}/\text{cm}^3$ or more. The impurity concentration of a portion of contact portion 5y other than a portion that is in contact with anode electrode pad 7b may be lower than that of the portion that is in contact with anode electrode pad 7b. In addition, the impurity concentration of the portion of contact portion 5y other than the portion that is in contact with anode electrode pad 7b may be lower than that of contact portion 5x.

It is noted that the remaining configuration of semiconductor device 100 of the fourth embodiment is similar to that of the above second embodiment. Therefore, the same components are denoted with the same reference characters and description thereof will not be repeated.

Next, the operation of the semiconductor device of the present embodiment will be described.

Referring to FIG. 20, in semiconductor device 100, channel 92 of p-channel depletion transistor DT is configured to have length L of 10 μm, total width Wt of 3000 μm, a thickness of 600 nm, and a concentration of $4\times10^{16}/\text{cm}^3$. Contact portion 5y is configured to have a length of 90 μm. Channel 92 of p-channel depletion transistor DT is set to generally have a resistance value of a little less than 10Ω when voltage V1 is 15 V.

As to the potential difference between channel 92 of p-channel depletion transistor DT and anode electrode pad 7b, the potential of an interface between channel 92 and contact portion 5y that configures the source region on the high potential side of p-channel depletion transistor DT is lower than that of V1 by resistance R4×current I. Therefore, the potential difference between the source side and the drain side of channel 92 becomes small, and thus, almost entire channel 92 undergoes depletion. Accordingly, depletion layer D spreads out in almost entire channel 92 of p-channel depletion transistor DT, and thus, the channel resistance becomes high.

On the other hand, as to the potential difference between channel 92 of p-channel depletion transistor DT and anode diffusion layer 3, the potential of the interface between channel 92 and contact portion 5y that configures the source region on the high potential side of p-channel depletion transistor DT is lower than that of V1 by resistance R4×current I. Therefore, the potential difference between the source side and the drain side of channel 92 becomes small, and contact portion 5y serves as a region having a large potential difference between channel 92 of p-channel depletion transistor DT and anode diffusion layer 3.

Consequently, accumulation layer A does not spread out in the region of channel 92 near contact portion 5x serving as the drain region of p-channel depletion transistor DT, and accumulation layer A does not spread out in the region of channel 92 near contact portion 5y serving as the source region of p-channel depletion transistor DT, either.

According to semiconductor device 100 of the present embodiment, the resistivity of a region that does not contribute to depletion is suppressed to be lower than that of semiconductor device 100 of the second embodiment, and thus, the resistance at low voltage can be lowered when semiconductor device 100 of the present embodiment has the equal current-limiting effect at high voltage.

In addition, according to semiconductor device 100 of the present embodiment, resistance R4 is formed integrally with contact portion 5y serving as the source of p-channel depletion transistor DT. Therefore, production efficiency can be improved.

Fifth Embodiment

A semiconductor device of a fifth embodiment of the present invention is different from the semiconductor device of the third embodiment mainly in that the channel of the n-channel depletion transistor has a medium concentration channel region.

Figure 21:
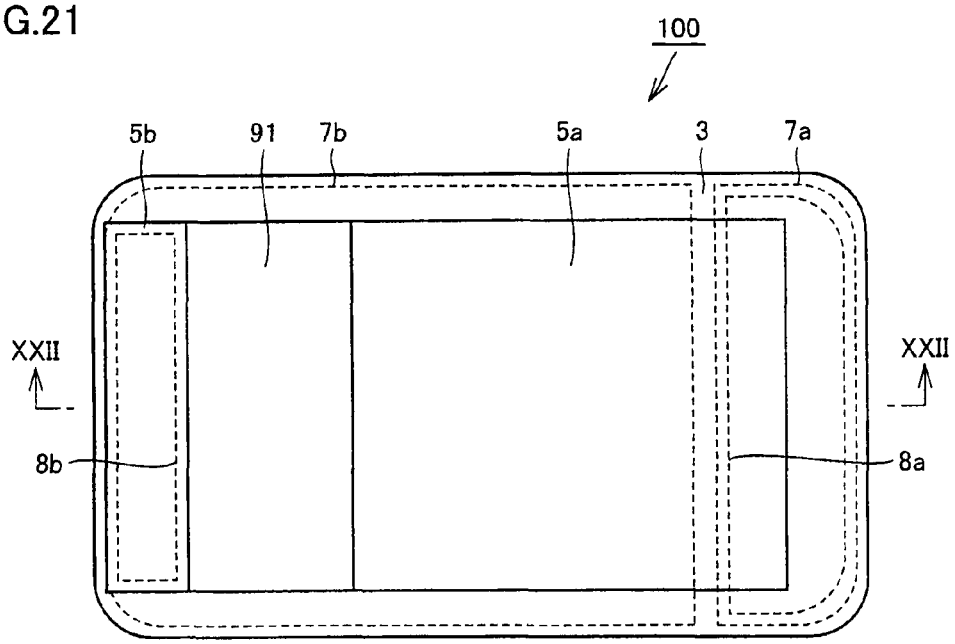
FIG. 21 is a schematic top view of a semiconductor device in a fifth embodiment of the present invention.
Figure 22:
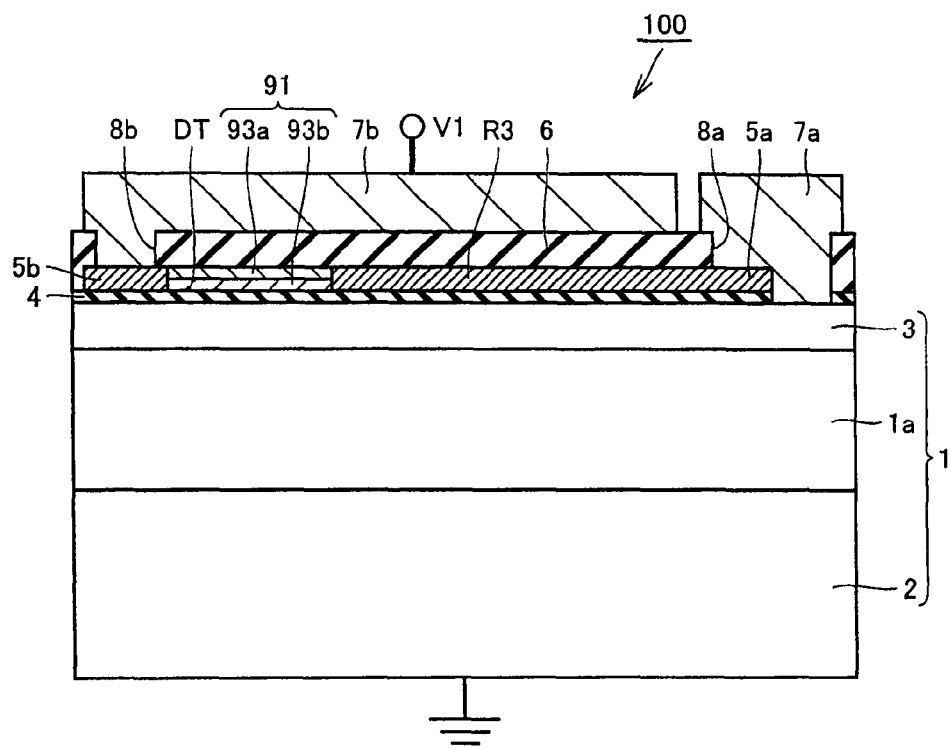
FIG. 22 is a schematic cross-sectional view taken along line XXII-XXII in FIG. 21.

Referring to FIGS. 21 and 22, n-channel depletion transistor DT has channel 91 that is a portion sandwiched between anode diffusion layer 3 and anode electrode pad 7b. Channel 91 has a first impurity concentration portion 93a and a second impurity concentration portion 93b. Second impurity concentration portion 93b configures the medium concentration channel region. First impurity concentration portion 93a is arranged on the higher potential side of anode diffusion layer 3 and anode electrode pad 7b. Second impurity concentration portion 93b is arranged on the lower potential side of anode diffusion layer 3 and anode electrode pad 7b. Second impurity concentration portion 93b has an n-type impurity concentration higher than that of first impurity concentration portion 93a. It is noted that the remaining configuration of semiconductor device 100 of the fifth embodiment is similar to that of the above third embodiment. Therefore, the same components are denoted with the same reference characters and description thereof will not be repeated.

The thickness and the concentration of second impurity concentration portion 93b serving as the medium concentration channel region are set such that the width of the depletion layer at a voltage at which the start of current limitation is desired becomes roughly equal to the thickness of second impurity concentration portion 93b.

In semiconductor device 100, since the impurity concentration of channel 91 is high on the anode diffusion layer 3 side of the diode serving as the gate of n-channel depletion transistor DT, the spread of depletion layer D is small when V1-V2 is small. Therefore, the channel resistance can be small. Depletion layer D rapidly spreads out when V1-V2 exceeds a certain value. Therefore, the channel resistance can be rapidly increased.

According to semiconductor device 100 of the present embodiment, first impurity concentration portion 93a of channel 91 is arranged on the higher potential side of anode diffusion layer 3 and anode electrode pad 7b. Second impurity concentration portion 93b is arranged on the lower potential side of anode diffusion layer 3 and anode electrode pad 7b, and has an n-type impurity concentration higher than that of first impurity concentration portion 93a. Therefore, the resistance during the normal operation can be decreased, as compared with that of the third embodiment.

Sixth Embodiment

A semiconductor device of a sixth embodiment of the present invention is different from the semiconductor device of the fourth embodiment mainly in that the channel of the p-channel depletion transistor has the medium concentration channel region.

Figure 23:
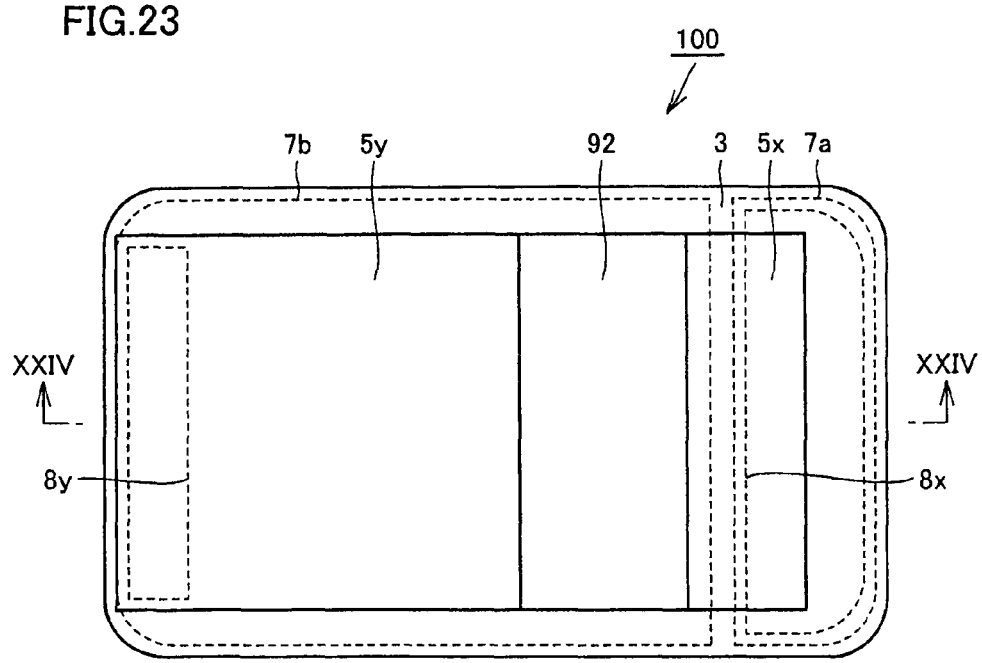
FIG. 23 is a schematic top view of a semiconductor device in a sixth embodiment of the present invention.
Figure 24:
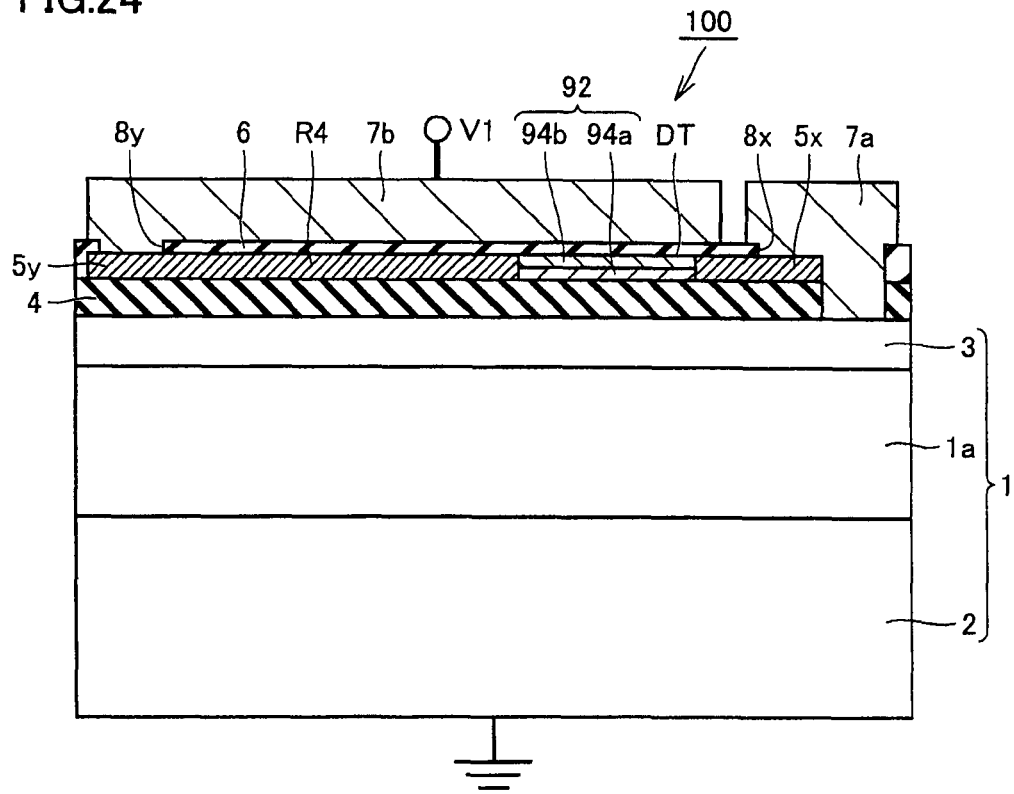
FIG. 24 is a schematic cross-sectional view taken along line XXIV-XXIV in FIG. 23.

Referring to FIGS. 23 and 24, p-channel depletion transistor DT has channel 92 that is a portion sandwiched between anode diffusion layer 3 and anode electrode pad 7b. Channel 92 has a first impurity concentration portion 94a and a second impurity concentration portion 94b. Second impurity concentration portion 94b configures the medium concentration channel region. First impurity concentration portion 94a is arranged on the lower potential side of anode diffusion layer 3 and anode electrode pad 7b. Second impurity concentration portion 94b is arranged on the higher potential side of anode diffusion layer 3 and anode electrode pad 7b. Second impurity concentration portion 94b has a p-type impurity concentration higher than that of first impurity concentration portion 94a.

It is noted that the remaining configuration of semiconductor device 100 of the sixth embodiment is similar to that of the above fourth embodiment. Therefore, the same components are denoted with the same reference characters and description thereof will not be repeated.

The thickness and the concentration of second impurity concentration portion 94b serving as the medium concentration channel region are set such that the width of the depletion layer at the voltage at which the start of current limitation is desired becomes roughly equal to the thickness of second impurity concentration portion 94b.

In semiconductor device 100, since the impurity concentration of channel 92 is high on the anode electrode pad 7b side serving as the gate of p-channel depletion transistor DT, the spread of depletion layer D is small when V1-V2 is small. Therefore, the channel resistance can be small. Depletion layer D rapidly spreads out when V1-V2 exceeds a certain value. Therefore, the channel resistance can be rapidly increased.

According to semiconductor device 100 of the present embodiment, first impurity concentration portion 94a of channel 92 is arranged on the lower potential side of anode diffusion layer 3 and anode electrode pad 7b. Second impurity concentration portion 94b is arranged on the higher potential side of anode diffusion layer 3 and anode electrode pad 7b, and has a p-type impurity concentration higher than that of first impurity concentration portion 94a. Therefore, the resistance during the normal operation can be decreased, as compared with that of the fourth embodiment.

Seventh Embodiment

A semiconductor device of a seventh embodiment of the present invention is different from the semiconductor device of the first embodiment mainly in that the semiconductor device of the seventh embodiment has the n-channel depletion transistor and the p-channel depletion transistor.

Figure 25:
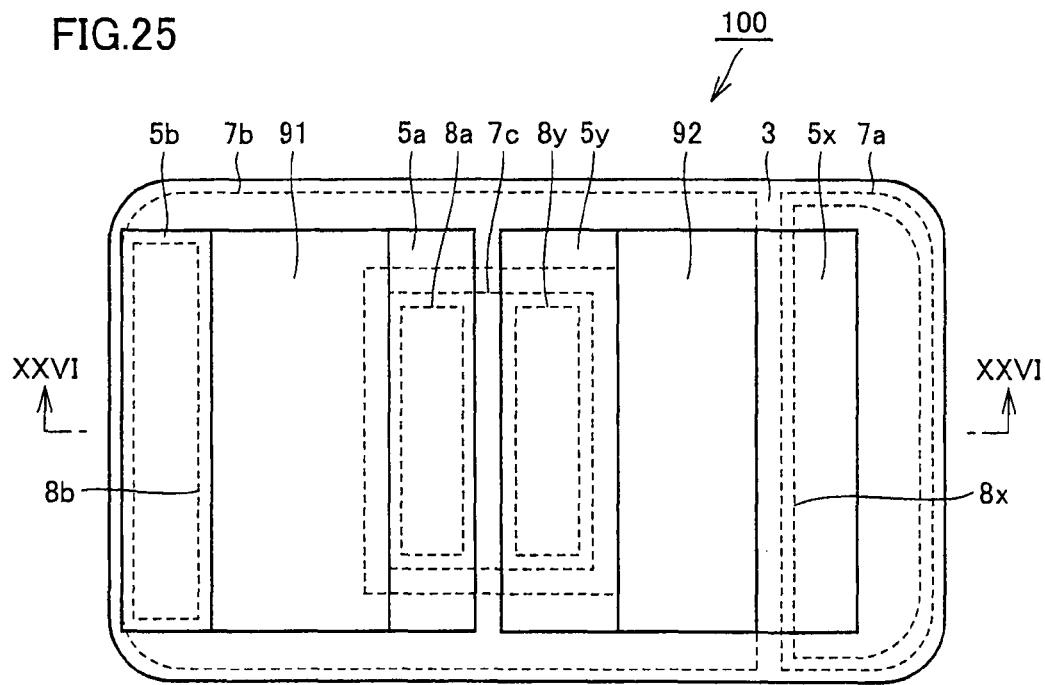
FIG. 25 is a schematic top view of a semiconductor device in a seventh embodiment of the present invention.
Figure 26:
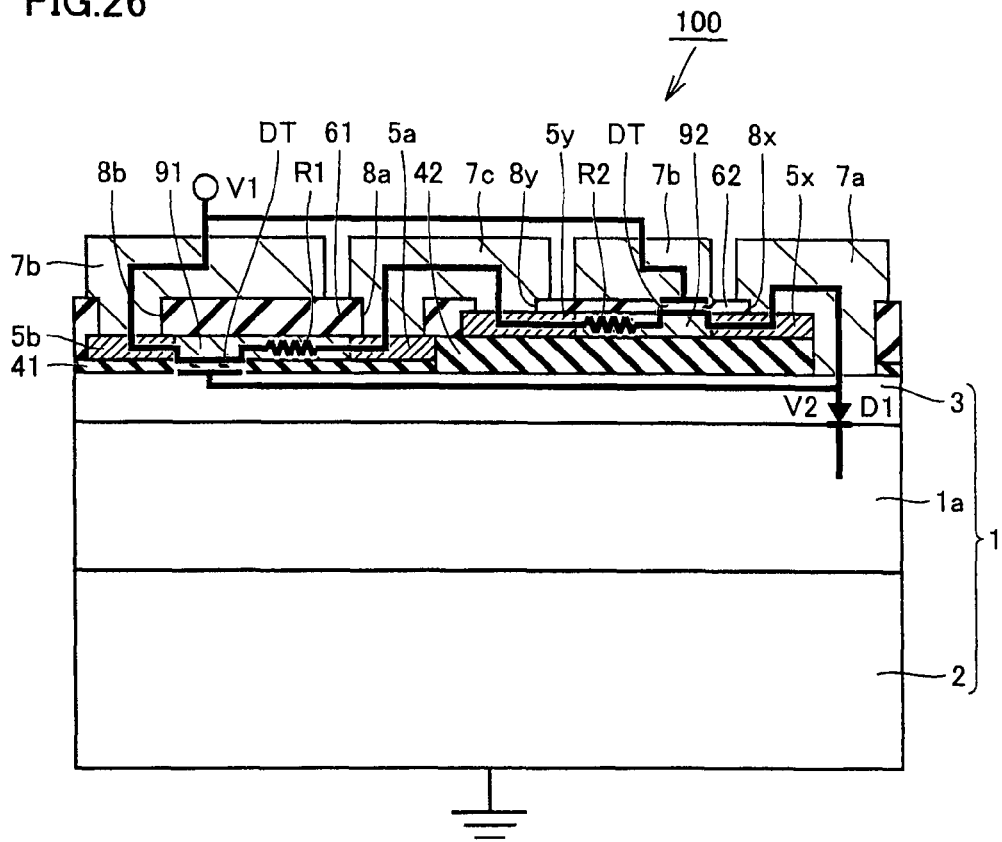
FIG. 26 is a schematic cross-sectional view taken along line XXVI-XXVI in FIG. 25.

Referring to FIGS. 25 and 26, semiconductor device 100 of the present embodiment has n-channel depletion transistor DT and p-channel depletion transistor DT.

N-channel depletion transistor DT having channel 91 and contact portions 5a and 5b is arranged on the high potential side on a first insulating film 41. First insulating film 41 has a thickness of, for example, 200 nm. Channel 91 and contact portions 5a and 5b are formed of the polycrystalline silicon layer having a thickness of, for example, about 600 nm. Channel 91 has an n-type impurity concentration of, for example, $5\times10^{15}/cm^3$ to $5\times10^{17}/cm^3$. Contact portions 5a and 5b have an n-type impurity concentration of, for example, $1\times10^{19}/cm^3$ or more.

Furthermore, anode electrode pad 7b is arranged on the high potential side on a second insulating film 61. Second insulating film 61 has a thickness of, for example, about 800 nm. Anode electrode pad 7b is made of a metal such as aluminum or aluminum alloy, for example. Contact portion 5b serving as the drain region on the high potential side of n-channel depletion transistor DT is electrically connected to anode electrode pad 7b through contact hole 8b.

P-channel depletion transistor DT having channel 92 and contact portions 5x and 5y is arranged on the low potential side on a first insulating film 42. First insulating film 42 has a thickness of, for example, 800 nm. Channel 92 and contact portions 5x and 5y are formed of the polycrystalline silicon layer having a thickness of, for example, about 600 nm. Channel 92 has a p-type impurity concentration of, for example, $5\times10^{15}/cm^3$ to $5\times10^{17}/cm^3$. Contact portions 5x and 5y have a p-type impurity concentration of, for example, $1\times10^{19}/cm^3$ or more.

Furthermore, anode electrode pad 7b is arranged on the low potential side on a second insulating film 62. Second insulating film 62 has a thickness of, for example, about 200 nm.

Contact portion 5x serving as the drain region on the low potential side of p-channel depletion transistor DT is electrically connected to anode diffusion layer 3 by wiring 7a through contact hole 8x. Wiring 7a is made of a metal such as aluminum or aluminum alloy, for example.

Contact portion 5a serving as the source region on the low potential side of n-channel depletion transistor DT and contact portion 5y serving as the source region on the high potential side of p-channel depletion transistor DT are serially connected to each other by a depletion transistor serial wiring 7c through contact hole 8a and contact hole 8y that are opened, respectively. Depletion transistor serial wiring 7c is made of a metal such as aluminum or aluminum alloy, for example.

Channel 91 of n-channel depletion transistor DT and channel 92 of p-channel depletion transistor DT are adjusted to obtain a resistance value corresponding to a desired transfer characteristic, using the length, the width, the thickness, and the concentration of channel 91 and channel 92 as parameters.

It is noted that contact portion 5a serving as the source region of n-channel depletion transistor DT and contact portion 5b serving as the drain region are for obtaining a low-resistance ohmic contact, and even if contact portion 5a and contact portion 5b are not provided, the essential effect of the present embodiment is not impaired. In addition, contact portion 5y serving as the source region of p-channel depletion transistor DT and contact portion 5x serving as the drain region are for obtaining a low-resistance ohmic contact, and even if contact portion 5y and contact portion 5x are not provided, the essential effect of the present embodiment is not impaired.

Moreover, even if first insulating film 41 is equal in thickness to second insulating film 61 or even if first insulating film 42 is equal in thickness to second insulating film 62, the effect of the present embodiment is never lost although the effect is reduced. Furthermore, even if first insulating film 41 is equal in thickness to first insulating film 42 or second insulating film 61 is equal in thickness to second insulating film 62 in n-channel depletion transistor DT and p-channel depletion transistor DT, the effect of the present embodiment is never lost although the effect is reduced.

It is noted that the remaining configuration of semiconductor device 100 of the seventh embodiment is similar to those of the first embodiment and the second embodiment as described above. Therefore, the same components are denoted with the same reference characters and description thereof will not be repeated.

It is noted that, in the present embodiment, n-channel depletion transistor DT according to the first embodiment is serially connected to p-channel depletion transistor DT according to the second embodiment with a resistance interposed therebetween. N-channel depletion transistor DT according to the third embodiment or the fifth embodiment may, however, be used as n-channel depletion transistor DT, and p-channel depletion transistor DT according to the fourth embodiment or the sixth embodiment may be used as p-channel depletion transistor DT.

As described above in the first embodiment and the second embodiment, in semiconductor device 100, n-channel depletion transistor DT is arranged on the high potential side and p-channel depletion transistor DT is arranged on the low potential side. By taking the gate potential of n-channel depletion transistor DT from anode diffusion layer 3 of the diode having more negative potential than the channel potential, and the gate potential of p-channel depletion transistor DT from anode electrode pad 7b having more positive potential than the channel potential, channel 91 of n-channel depletion transistor DT and channel 92 of p-channel depletion transistor DT both undergo depletion when V1-V2 is large. As a result, semiconductor device 100 can have a strong function of limiting current and can achieve V1<Vmax×I1/Imax+ΔV during the normal operation.

According to semiconductor device 100 of the present embodiment, anode diffusion layer 3, p-channel depletion transistor DT, resistances R1 and R2, n-channel depletion transistor DT, and anode electrode pad 7b are serially connected in ascending order of potential. Channel 91 of n-channel depletion transistor DT is configured to overlie at least a part of anode diffusion layer 3 with first insulating film 41 interposed therebetween, and channel 92 of p-channel depletion transistor DT is configured to underlie at least a part of anode electrode pad 7b with second insulating film 62 interposed therebetween. As a result, semiconductor device 100 can have the strong function of limiting current and can achieve V1<Vmax×I1/Imax+ΔV during the normal operation.

It is noted that, although n-channel depletion transistor DT and p-channel depletion transistor DT are arranged on the anode side of the diode in the above, n-channel depletion transistor DT and p-channel depletion transistor DT may be arranged on the cathode side of the diode.

Figure 27:
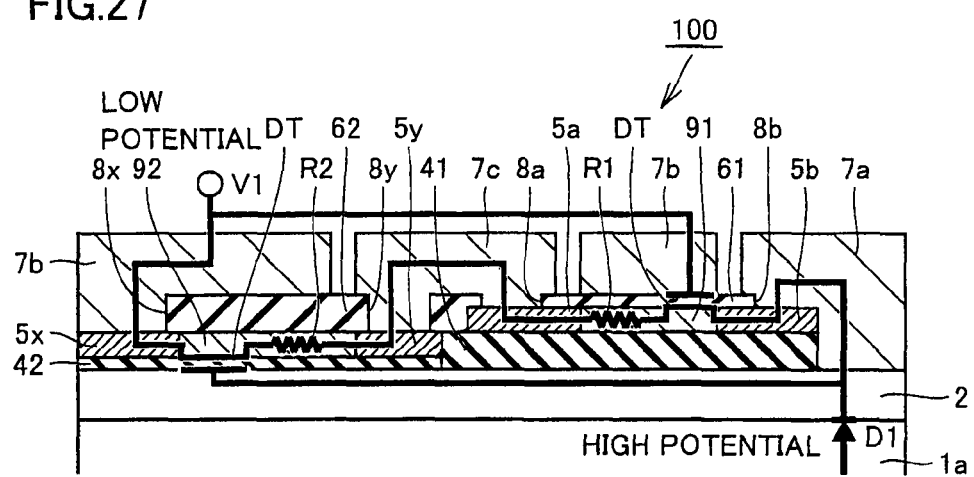
FIG. 27 schematically illustrates a cross-sectional structure on the cathode side of the semiconductor device in the seventh embodiment of the present invention and an equivalent circuit thereof.

Referring to FIG. 27, n-channel depletion transistor DT having channel 91 and contact portions 5a and 5b is arranged on the high potential side on first insulating film 41. First insulating film 41 has a thickness of, for example, 800 nm. Channel 91 and contact portions 5a and 5b are formed of the polycrystalline silicon layer having a thickness of, for example, about 600 nm. Channel 91 has an n-type impurity concentration of, for example, $5 \times 10^{15}/cm^3$ to $5 \times 10^{17}/cm^3$. Contact portions 5a and 5b have an n-type impurity concentration of, for example, $1 \times 10^{19}/cm^3$ or more.

Furthermore, cathode electrode pad 7b is arranged on the low potential side on second insulating film 61. Second insulating film 61 has a thickness of, for example, about 200 nm. Cathode electrode pad 7b is made of a metal such as aluminum or aluminum alloy, for example. Contact portion 5b serving as the drain region on the high potential side of n-channel depletion transistor DT is electrically connected to cathode diffusion layer 2 by wiring 7a through contact hole 8b. Wiring 7a is made of a metal such as aluminum or aluminum alloy, for example.

P-channel depletion transistor DT having channel 92 and contact portions 5x and 5y is arranged on the low potential side on first insulating film 42. First insulating film 42 has a thickness of, for example, 200 nm. Channel 92 and contact portions 5x and 5y are formed of the polycrystalline silicon layer having a thickness of, for example, about 600 nm. Channel 92 has a p-type impurity concentration of, for example, $5 \times 10^{15}/cm^3$ to $5 \times 10^{17}/cm^3$. Contact portions 5x and 5y have a p-type impurity concentration of, for example, $1 \times 10^{19}/cm^3$ or more.

Furthermore, cathode electrode pad 7b is arranged on the low potential side on second insulating film 62. Second insulating film 62 has a thickness of, for example, about 800 nm.

Contact portion 5x serving as the drain region on the low potential side of p-channel depletion transistor DT is electrically connected to cathode electrode pad 7b through contact hole 8x.

Contact portion 5a serving as the source region on the low potential side of n-channel depletion transistor DT and contact portion 5y serving as the source region on the high potential side of p-channel depletion transistor DT are serially connected to each other by depletion transistor serial wiring 7c through contact hole 8a and contact hole 8y that are opened, respectively. Depletion transistor serial wiring 7c is made of a metal such as aluminum or aluminum alloy, for example.

Channel 91 of n-channel depletion transistor DT and channel 92 of p-channel depletion transistor DT are adjusted to obtain a resistance value corresponding to a desired transfer characteristic, using the length, the width, the thickness, and the concentration of channel 91 and channel 92 as parameters.

The remaining configuration of the semiconductor device in which n-channel depletion transistor DT and p-channel depletion transistor DT are arranged on the cathode side of the diode is similar to that of the above-described semiconductor device in which n-channel depletion transistor DT and p-channel depletion transistor DT are arranged on the anode side of the diode. Therefore, the same components are denoted with the same reference characters and description thereof will not be repeated.

According to semiconductor device 100 of the present embodiment, cathode diffusion layer 2, n-channel depletion transistor DT, resistances R1 and R2, p-channel depletion transistor DT, and anode electrode pad 7b are serially connected in descending order of potential. Channel 92 of p-channel depletion transistor DT is configured to overlie at least a part of cathode diffusion layer 2 with first insulating film 42 interposed therebetween, and channel 91 of n-channel depletion transistor DT is configured to underlie at least a part of anode electrode pad 7b with second insulating film 61 interposed therebetween. As a result, semiconductor device 100 can have the strong function of limiting current and can achieve V1<Vmax×I1/Imax+ΔV during the normal operation.

Eighth Embodiment

A semiconductor device of an eighth embodiment of the present invention is different from the semiconductor device of the first embodiment mainly in that the semiconductor device of the eighth embodiment has an n-channel junction-type field effect transistor.

Figure 28:
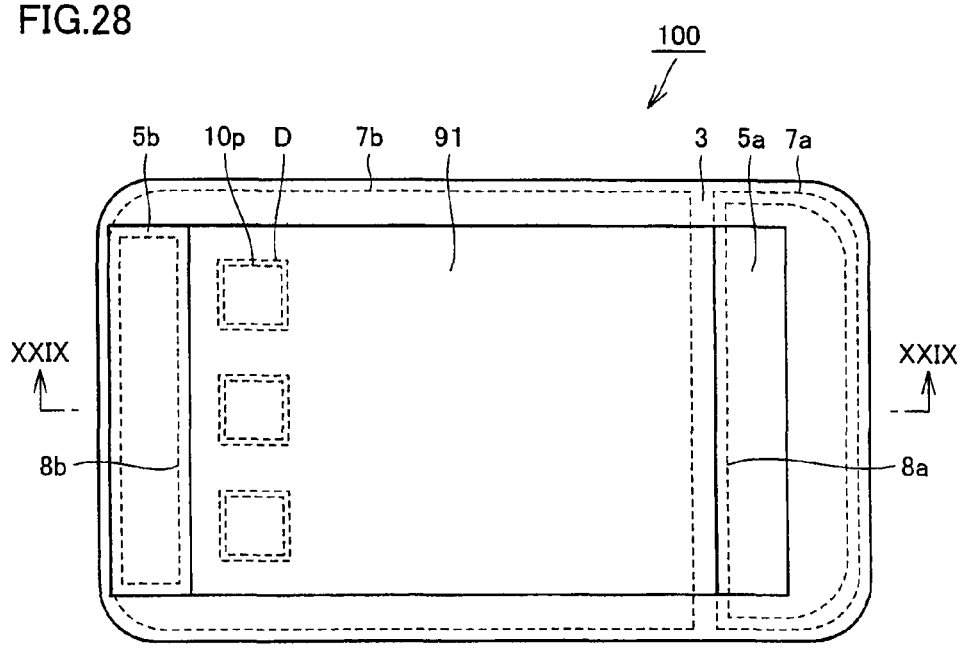
FIG. 28 is a schematic top view of a semiconductor device in an eighth embodiment of the present invention.
Figure 29:
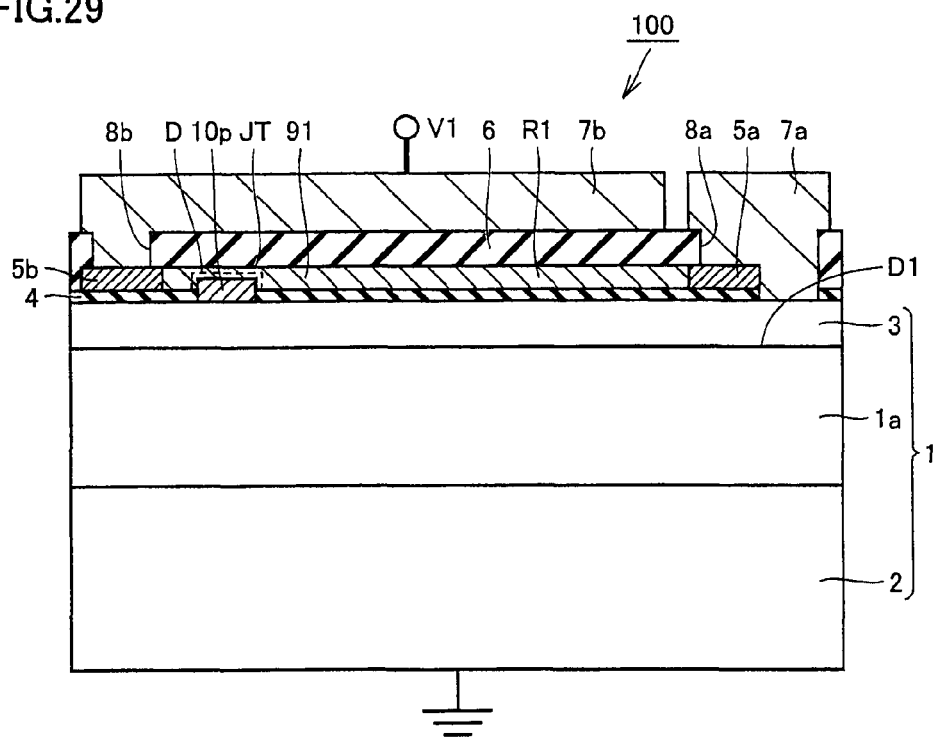
FIG. 29 is a schematic cross-sectional view taken along line XXIX-XXIX in FIG. 28.

Referring to FIGS. 28 and 29, channel 91 and contact portions 5a and 5b configure an n-channel junction-type field effect transistor JT. Semiconductor device 100 of the present embodiment is configured to produce the depletion layer in channel 91 of n-channel junction-type field effect transistor JT based on the gate potential.

A p-type region 10p corresponding to a gate of n-channel junction-type field effect transistor JT is placed in a region near contact portion 5b serving as a drain region of channel 91 of n-channel junction-type field effect transistor JT, and the potential of anode diffusion layer 3 of the diode is applied to p-type region 10p.

In n-channel junction-type field effect transistor JT, depletion layer D can be spread in a direction of the channel width as well, and thus, a plurality of p-type regions 10p are spaced and disposed in the form of stepping-stones in the width direction of channel 91 as shown in FIG. 28.

Figure 30:
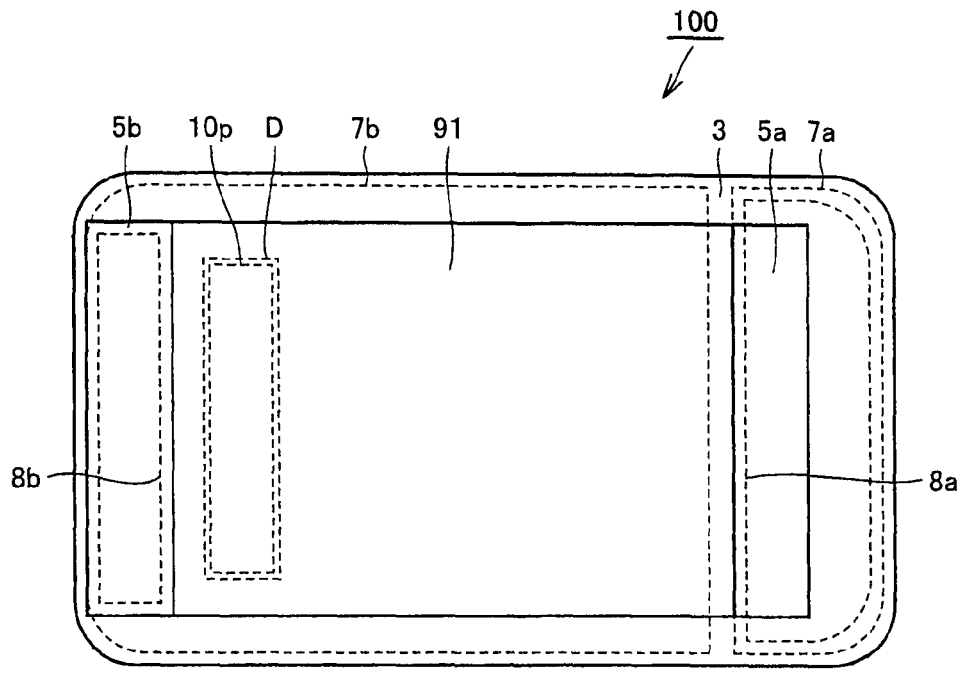
FIG. 30 is a schematic top view of the semiconductor device in the eighth embodiment of the present invention, in which a p-type region is arranged in the form of a stripe.

It is noted that, referring to FIG. 30, p-type region 10p may be arranged in the form of a stripe.

Channel 91 of n-channel junction-type field effect transistor JT is adjusted to obtain a resistance value corresponding to a desired transfer characteristic, using the length, the width, the thickness, and the concentration of channel 91 as parameters.

Semiconductor device 100 has a configuration in which rectifying element D1, resistance R1, n-channel junction-type field effect transistor JT, and anode electrode pad 7b are serially connected. Semiconductor device 100 is configured to generate a gate potential of n-channel junction-type field effect transistor JT based on a difference in potential across resistance R1 and to produce depletion layer D in channel 91 of n-channel junction-type field effect transistor JT based on the gate potential.

The potential of anode diffusion layer 3, which is the lower one of the potential of anode diffusion layer 3 and the potential of anode electrode pad 7b, is used as the gate potential of n-channel junction-type field effect transistor JT.

It is noted that contact portion 5a serving as a source region of n-channel junction-type field effect transistor JT and contact portion 5b serving as the drain region are for obtaining a low-resistance ohmic contact, and even if contact portion 5a and contact portion 5b are not provided, the essential effect of the present embodiment is not impaired.

It is noted that the remaining configuration of semiconductor device 100 of the eighth embodiment is similar to that of the above first embodiment. Therefore, the same components are denoted with the same reference characters and description thereof will not be repeated.

Next, the operation of the semiconductor device of the present embodiment will be described.

In n-channel junction-type field effect transistor JT, when a negative potential is applied to the gate thereof, depletion layer D spreads out and the channel resistance increases.

Accordingly, by the operation similar to that performed in the first embodiment, semiconductor device 100 can have the current-limiting function and can achieve $V1<Vmax \times I1/Imax+\Delta V$ during the normal operation.

Figure 31:
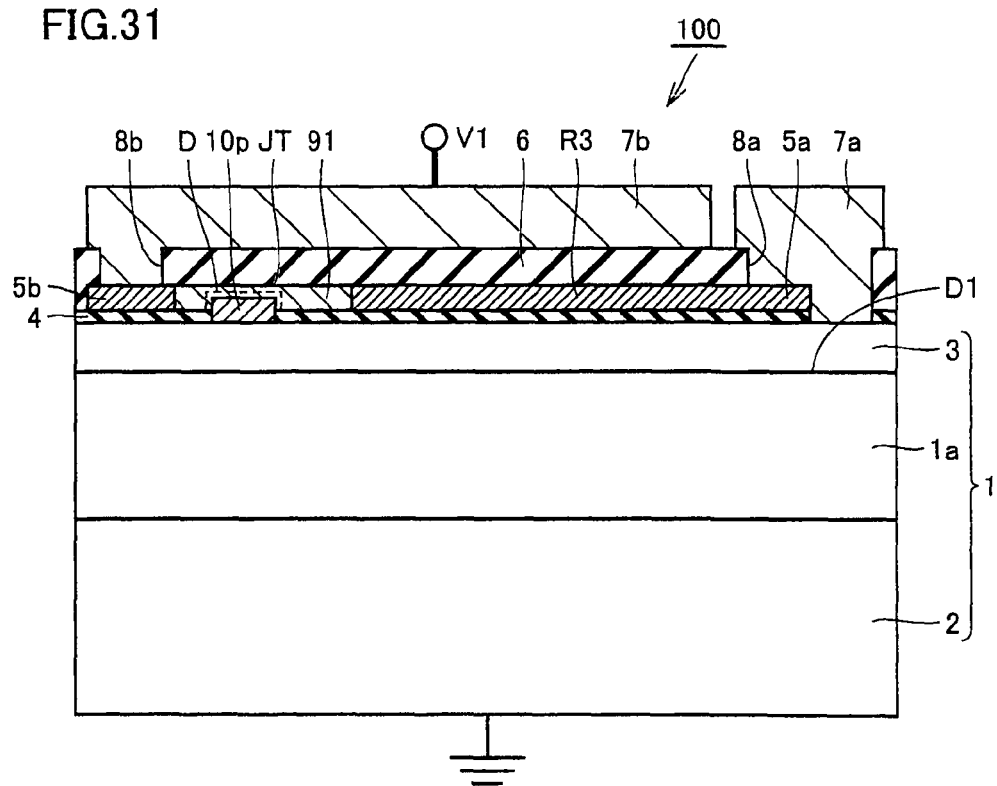
FIG. 31 is a schematic cross-sectional view of the semiconductor device in which a source region in the eighth embodiment of the present invention has a structure corresponding to that of the third embodiment, and the cross-sectional position corresponds to line XXIX-XXIX in FIG. 28.

It is noted that, in the present embodiment, similar n-channel junction-type field effect transistor JT is used instead of n-channel depletion transistor DT of the first embodiment. An n-channel junction-type field effect transistor JT having a structure corresponding to that of n-channel depletion transistor DT of the third embodiment or the fifth embodiment, however, may be used as shown in FIG. 31.

According to semiconductor device 100 of the present embodiment, there can be provided a semiconductor device having reasonably large current at low voltage and small current at high voltage because semiconductor device 100 is configured to produce depletion layer D in channel 91 of n-channel junction-type field effect transistor JT based on the gate potential.

In addition, according to semiconductor device 100 of the present embodiment, the potential of anode diffusion layer 3, which is the lower one of the potential of anode diffusion layer 3 and the potential of anode electrode pad 7b, is used as the gate potential of n-channel junction-type field effect transistor JT. Therefore, there can be provided a semiconductor device having reasonably large current at low voltage and small current at high voltage.

Furthermore, according to semiconductor device 100 of the present embodiment, resistance R1 is formed integrally with channel 91 of n-channel junction-type field effect transistor JT. Therefore, production efficiency can be improved.

Moreover, according to semiconductor device 100 of the present embodiment, p-type region 10p serving as the gate of n-channel junction-type field effect transistor JT is spaced and arranged in the form of a stepping-stone in the width direction of channel 91. Therefore, the channel thickness of the spacing portion increases, and thus, voltage V1 during the normal operation can be lowered.

Figure 32:
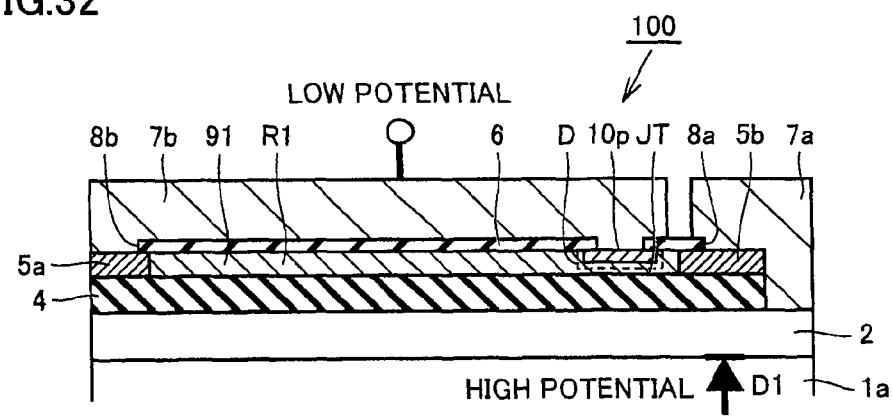
FIG. 32 schematically illustrates a cross-sectional structure in which an n-channel junction-type field effect transistor is arranged on the cathode side of a diode of the semiconductor device in the eighth embodiment of the present invention, and the cross-sectional position corresponds to line XXIX-XXIX in FIG. 28.

It is noted that, although n-channel junction-type field effect transistor JT is arranged on the anode side of the diode in the above, n-channel junction-type field effect transistor JT may be arranged on the cathode side of the diode as shown in FIG. 32. In this case, the diode serving as rectifying element D1 includes cathode diffusion layer 2 and the electrode pad includes cathode electrode pad 7b.

Ninth Embodiment

A semiconductor device of a ninth embodiment of the present invention is different from the semiconductor device of the second embodiment mainly in that the semiconductor device of the ninth embodiment has a p-channel junction-type field effect transistor.

Figure 33:
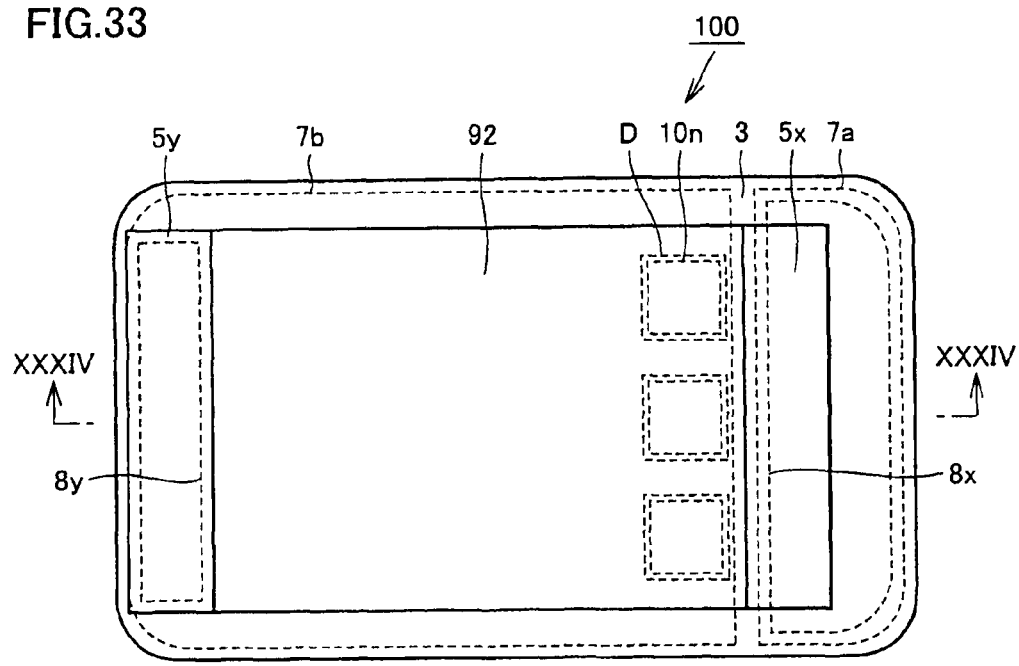
FIG. 33 is a schematic top view of a semiconductor device in a ninth embodiment of the present invention.
Figure 34:
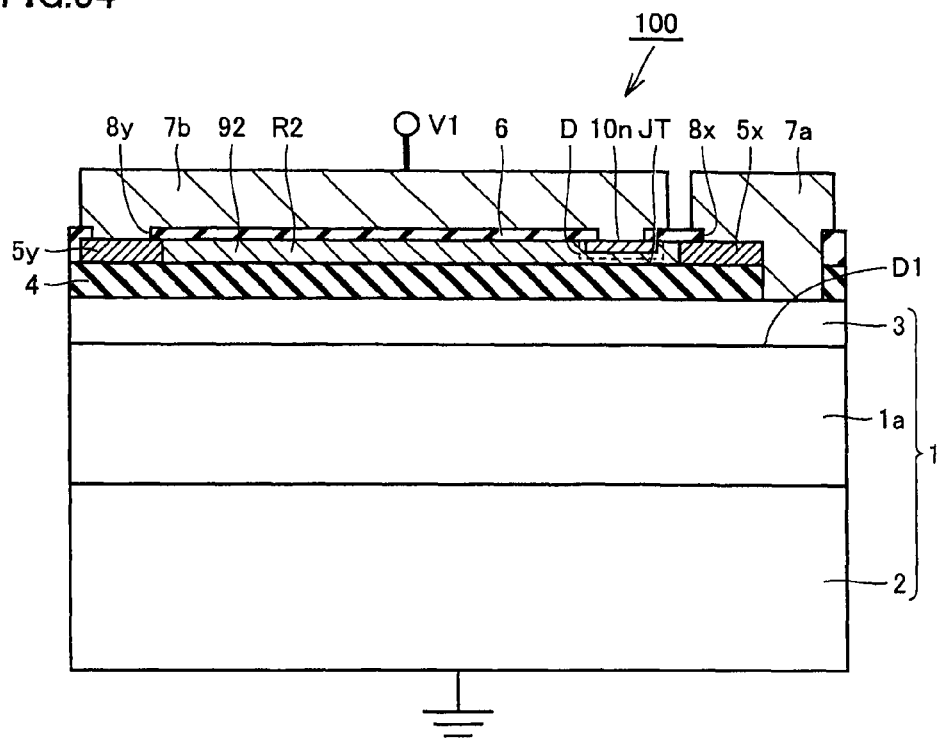
FIG. 34 is a schematic cross-sectional view taken along line XXXIV-XXXIV in FIG. 33.

Referring to FIGS. 33 and 34, channel 92 and contact portions 5x and 5y configure a p-channel junction-type field effect transistor JT. Semiconductor device 100 of the present embodiment is configured to produce the depletion layer in channel 92 of p-channel junction-type field effect transistor JT based on the gate potential.

An n-type region 10n corresponding to a gate of p-channel junction-type field effect transistor JT is placed in a region near contact portion 5x serving as a drain region of channel 92 of p-channel junction-type field effect transistor JT, and the potential of anode electrode pad 7b of the diode is applied to n-type region 10n.

In p-channel junction-type field effect transistor JT, depletion layer D can be spread in a direction of the channel width as well, and thus, a plurality of n-type regions 10n are spaced and disposed in the form of stepping-stones in the width direction of channel 92 as shown in FIG. 34.

Figure 35:
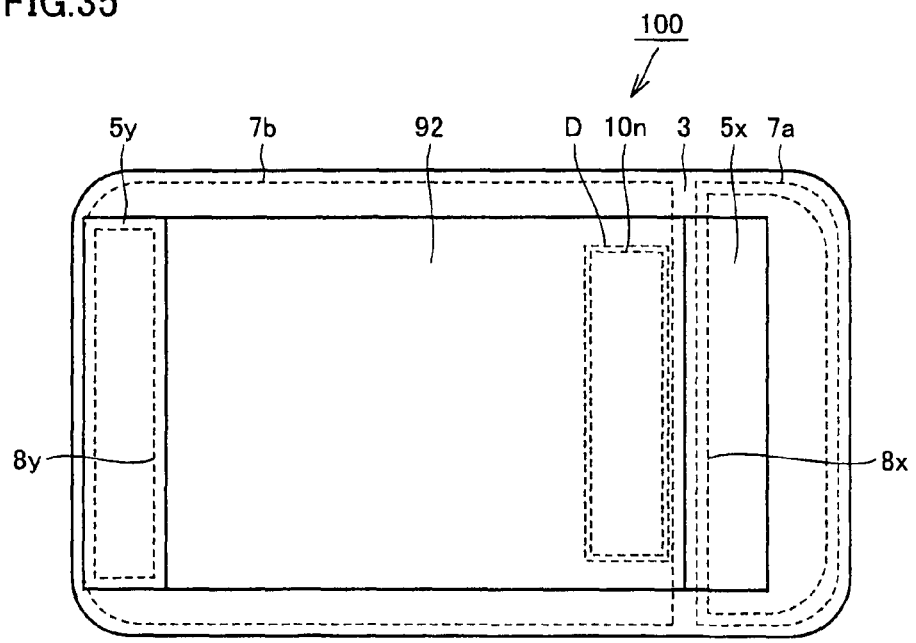
FIG. 35 is a schematic top view of the semiconductor device in the ninth embodiment of the present invention, in which an n-type region is arranged in the form of a stripe.

It is noted that, referring to FIG. 35, n-type region 10n may be arranged in the form of a stripe.

Channel 92 of p-channel junction-type field effect transistor JT is adjusted to obtain a resistance value corresponding to a desired transfer characteristic, using the length, the width, the thickness, and the concentration of channel 92 as parameters.

Semiconductor device 100 has a configuration in which rectifying element D1, resistance R2, p-channel junction-type field effect transistor JT, and anode electrode pad 7b are serially connected. Semiconductor device 100 is configured to generate a gate potential of p-channel junction-type field effect transistor JT based on a difference in potential across resistance R2 and to produce depletion layer D in channel 92 of p-channel junction-type field effect transistor JT based on the gate potential.

The potential of anode electrode pad 7b, which is the higher one of the potential of anode diffusion layer 3 and the potential of anode electrode pad 7b, is used as the gate potential of p-channel junction-type field effect transistor JT.

It is noted that contact portion 5x serving as the drain region of p-channel junction-type field effect transistor JT and contact portion 5y serving as the source region are for obtaining a low-resistance ohmic contact, and even if contact portion 5x and contact portion 5y are not provided, the essential effect of the present embodiment is not impaired.

It is noted that the remaining configuration of semiconductor device 100 of the ninth embodiment is similar to that of the above second embodiment. Therefore, the same components are denoted with the same reference characters and description thereof will not be repeated.

Figure 36:
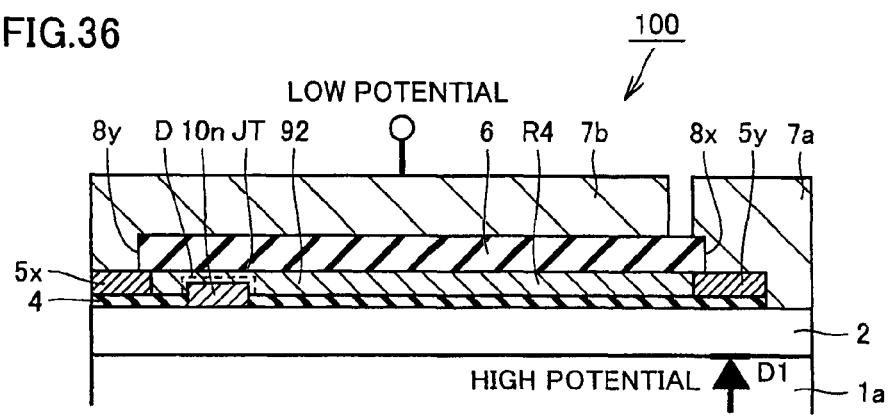
FIG. 36 schematically illustrates a cross-sectional structure in which a p-channel junction-type field effect transistor is arranged on the cathode side of a diode of the semiconductor device in the ninth embodiment of the present invention, and the cross-sectional position corresponds to line XXXIV-XXXIV in FIG. 33.

It is noted that, although p-channel junction-type field effect transistor JT is arranged on the anode side of the diode in the above, p-channel junction-type field effect transistor JT may be arranged on the cathode side of the diode as shown in FIG. 36. In this case, the diode serving as rectifying element D1 includes cathode diffusion layer 2 and the electrode pad includes cathode electrode pad 7b.

Next, the operation of the semiconductor device of the present embodiment will be described.

In p-channel junction-type field effect transistor JT, when a positive potential is applied to the gate thereof, depletion layer D spreads out and the channel resistance increases.

Accordingly, by the operation similar to that performed in the second embodiment, semiconductor device 100 can have the current-limiting function and can achieve V1<Vmax×I1/Imax+ΔV during the normal operation.

Figure 37:
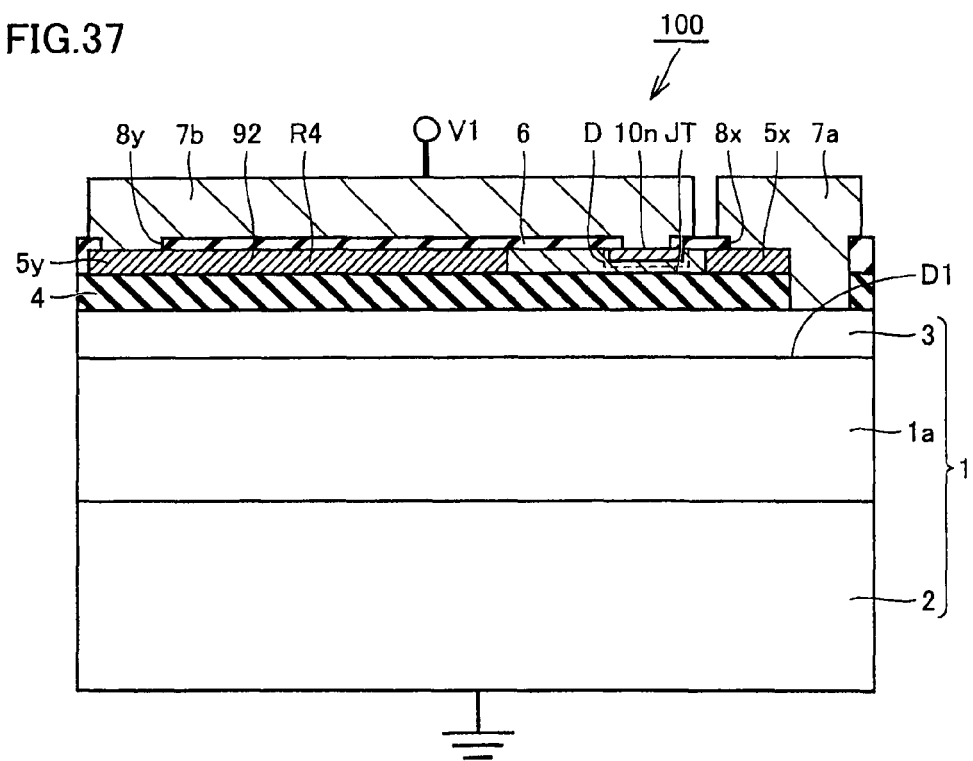
FIG. 37 is a schematic cross-sectional view of the semiconductor device in which a source region in the ninth embodiment of the present invention has a structure corresponding to that of the fourth embodiment, and the cross-sectional position corresponds to line XXXIV-XXXIV in FIG. 33.

It is noted that, in the present embodiment, similar p-channel junction-type field effect transistor JT is used instead of p-channel depletion transistor DT of the second embodiment. A p-channel junction-type field effect transistor JT having a structure corresponding to that of p-channel depletion transistor DT of the fourth embodiment or the sixth embodiment, however, may be used as shown in FIG. 37.

According to semiconductor device 100 of the present embodiment, there can be provided a semiconductor device having reasonably large current at low voltage and small current at high voltage because semiconductor device 100 is configured to produce depletion layer D in channel 92 of p-channel junction-type field effect transistor JT based on the gate potential.

In addition, according to semiconductor device 100 of the present embodiment, the potential of anode electrode pad 7b, which is the higher one of the potential of anode diffusion layer 3 and the potential of anode electrode pad 7b, is used as the gate potential of p-channel junction-type field effect transistor JT. Therefore, there can be provided a semiconductor device having reasonably large current at low voltage and small current at high voltage.

Furthermore, according to semiconductor device 100 of the present embodiment, resistance R2 is formed integrally with channel 92 of p-channel junction-type field effect transistor JT. Therefore, production efficiency can be improved.

Moreover, according to semiconductor device 100 of the present embodiment, n-type region 10n serving as the gate of p-channel junction-type field effect transistor JT is spaced and arranged in the form of a stepping-stone in the width direction of channel 92. Therefore, the channel thickness of the spacing portion increases, and thus, voltage V1 during the normal operation can be lowered.

Each embodiment described above can be combined as appropriate.

It should be understood that the embodiments disclosed herein are illustrative and not limitative in any respect. The scope of the present invention is defined by the terms of the claims, rather than the above description, and is intended to include any modifications within the scope and meaning equivalent to the terms of the claims.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
a rectifying element;
an electrode pad electrically connected to said rectifying element; and
a resistance and a depletion transistor arranged between said rectifying element and said electrode pad, and electrically connected to each other, the resistance and a depletion layer of the depletion transistor being included in a same layer of the semiconductor device,
wherein:
said rectifying element, said resistance, said depletion transistor, and said electrode pad are serially connected,
said semiconductor device being configured to generate a gate potential of said depletion transistor based on a difference in potential across said resistance, and
the depletion layer in a channel of said depletion transistor is controlled by said gate potential,
the semiconductor device further comprising:
a first insulating film and a second insulating film, wherein
said rectifying element includes an anode,
said depletion transistor includes an n-channel depletion transistor,
said electrode pad includes an anode electrode pad,
said anode of said rectifying element, said resistance, said n-channel depletion transistor, and said anode electrode pad are serially connected in ascending order of potential,
said channel of said n-channel depletion transistor overlies said anode of said rectifying element with said first insulating film interposed therebetween, and underlies said anode electrode pad with said second insulating film interposed therebetween, and
said semiconductor device is configured such that a value obtained by dividing a dielectric constant of said first insulating film by a thickness of said first insulating film is larger than a value obtained by dividing a dielectric constant of said second insulating film by a thickness of said second insulating film.

2. The semiconductor device according to claim 1, wherein said depletion transistor includes an n-channel depletion transistor, and
said semiconductor device is configured such that a lower potential of a potential of a part of said rectifying element and a potential of said electrode pad is used as said gate potential of said n-channel depletion transistor.

3. The semiconductor device according to claim 1, wherein said depletion transistor includes a p-channel depletion transistor, and
said semiconductor device is configured such that a higher potential of a potential of a part of said rectifying element and a potential of said electrode pad is used as said gate potential of said p-channel depletion transistor.

4. The semiconductor device according to claim 1, further comprising
a first insulating film and a second insulating film, wherein
said rectifying element includes a cathode,
said depletion transistor includes an n-channel depletion transistor,
said electrode pad includes a cathode electrode pad,
said cathode of said rectifying element, said n-channel depletion transistor, said resistance, and said cathode electrode pad are serially connected in descending order of potential,
said channel of said n-channel depletion transistor overlies said cathode of said rectifying element with said first insulating film interposed therebetween, and underlies said cathode electrode pad with said second insulating film interposed therebetween, and said semiconductor device is configured such that a value obtained by dividing a dielectric constant of said first insulating film by a thickness of said first insulating film is smaller than a value obtained by dividing a dielectric constant of said second insulating film by a thickness of said second insulating film.

5. The semiconductor device according to claim 1, further comprising a first insulating film and a second insulating film, wherein said rectifying element includes an anode, said depletion transistor includes a p-channel depletion transistor, said electrode pad includes an anode electrode pad, said anode of said rectifying element, said p-channel depletion transistor, said resistance, and said anode electrode pad are serially connected in ascending order of potential, said channel of said p-channel depletion transistor underlies said anode electrode pad with said second insulating film interposed therebetween, and overlies said anode of said rectifying element with said first insulating film interposed therebetween, and said semiconductor device is configured such that a value obtained by dividing a dielectric constant of said second insulating film by a thickness of said second insulating film is larger than a value obtained by dividing a dielectric constant of said first insulating film by a thickness of said first insulating film.

6. The semiconductor device according to claim 1, further comprising a first insulating film and a second insulating film, wherein said rectifying element includes a cathode, said depletion transistor includes a p-channel depletion transistor, said electrode pad includes a cathode electrode pad, said cathode of said rectifying element, said resistance, said p-channel depletion transistor, and said cathode electrode pad are serially connected in descending order of potential, said channel of said p-channel depletion transistor underlies said cathode electrode pad with said second insulating film interposed therebetween, and overlies said cathode of said rectifying element with said first insulating film interposed therebetween, and said semiconductor device is configured such that a value obtained by dividing a dielectric constant of said second insulating film by a thickness of said second insulating film is smaller than a value obtained by dividing a dielectric constant of said first insulating film by a thickness of said first insulating film.

7. The semiconductor device according to claim 1, wherein said depletion transistor includes a source, and said resistance is formed integrally with said channel or said source of said depletion transistor.

8. The semiconductor device according to claim 1, wherein said depletion transistor includes an n-channel depletion transistor, said n-channel depletion transistor has a portion sandwiched between a part of said rectifying element and said electrode pad, said portion sandwiched includes a first impurity concentration portion and a second impurity concentration portion, said first impurity concentration portion is arranged on a higher potential side of the part of said rectifying element and said electrode pad, and said second impurity concentration portion is arranged on a lower potential side of the part of said rectifying element and said electrode pad, and has an n-type impurity concentration higher than that of said first impurity concentration portion.

9. The semiconductor device according to claim 1, wherein said depletion transistor includes a p-channel depletion transistor, said p-channel depletion transistor has a portion sandwiched between a part of said rectifying element and said electrode pad, said portion sandwiched includes a first impurity concentration portion and a second impurity concentration portion, said first impurity concentration portion is arranged on a lower potential side of the part of said rectifying element and said electrode pad, and said second impurity concentration portion is arranged on a higher potential side of the part of said rectifying element and said electrode pad, and has a p-type impurity concentration higher than that of said first impurity concentration portion.

10. The semiconductor device according to claim 1, further comprising a first insulating film and a second insulating film, wherein said rectifying element includes an anode, said depletion transistor includes an n-channel depletion transistor and a p-channel depletion transistor, said electrode pad includes an anode electrode pad, said anode of said rectifying element, said p-channel depletion transistor, said resistance, said n-channel depletion transistor, and said anode electrode pad are serially connected in ascending order of potential, said semiconductor device is configured such that said channel of said n-channel depletion transistor overlies at least a part of said anode of said rectifying element with said first insulating film interposed therebetween, and said semiconductor device is configured such that said channel of said p-channel depletion transistor underlies at least a part of said anode electrode pad with said second insulating film interposed therebetween.

11. The semiconductor device according to claim 1, further comprising a first insulating film and a second insulating film, wherein said rectifying element includes a cathode, said depletion transistor includes an n-channel depletion transistor and a p-channel depletion transistor, said electrode pad includes a cathode electrode pad, said cathode of said rectifying element, said n-channel depletion transistor, said resistance, said p-channel depletion transistor, and said cathode electrode pad are serially connected in descending order of potential, said semiconductor device is configured such that said channel of said p-channel depletion transistor overlies at least a part of said cathode of said rectifying element with said first insulating film interposed therebetween, and said semiconductor device is configured such that said channel of said n-channel depletion transistor underlies at least a part of said cathode electrode pad with said second insulating film interposed therebetween.

12. The semiconductor device according to claim 1, wherein said rectifying element includes an anode, and said electrode pad is an anode electrode pad connected to said anode side.

13. The semiconductor device according to claim 1, wherein said rectifying element includes a cathode, and said electrode pad is a cathode electrode pad connected to said cathode side.

* * * * *